United States Patent
Yakubo et al.

(10) Patent No.: US 9,633,709 B2
(45) Date of Patent: Apr. 25, 2017

(54) STORAGE DEVICE INCLUDING TRANSISTOR COMPRISING OXIDE SEMICONDUCTOR

(71) Applicant: Semiconductor Energy Laboratory Co., Ltd., Atsugi-shi, Kanagawa-ken (JP)

(72) Inventors: Yuto Yakubo, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/718,143

(22) Filed: May 21, 2015

(65) Prior Publication Data

US 2015/0340076 A1  Nov. 26, 2015

(30) Foreign Application Priority Data

May 23, 2014 (JP) ................. 2014-107401

(51) Int. Cl.
*G11C 11/24* (2006.01)
*H01L 29/24* (2006.01)
(Continued)

(52) U.S. Cl.
CPC ............ *G11C 11/24* (2013.01); *G11C 11/565* (2013.01); *G11C 11/5621* (2013.01);
(Continued)

(58) Field of Classification Search
CPC ... G11C 11/24; G11C 11/565; G11C 11/5621; H01L 27/1156; H01L 27/108;
(Continued)

(56) References Cited

U.S. PATENT DOCUMENTS 5,396,461 A * 3/1995 Fukumoto ............. G11C 14/00
365/149
5,731,856 A   3/1998 Kim et al.
(Continued)

FOREIGN PATENT DOCUMENTS

EP    1737044 A   12/2006
EP    2226847 A   9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — J. H. Hur
(74) *Attorney, Agent, or Firm* — Fish & Richardson P.C.

(57) ABSTRACT

A highly reliable storage device with small data deterioration is provided. The storage device includes a first circuit, a second circuit, a third circuit, and a memory cell. The first circuit has a function of detecting power-on. The second circuit has a function of specifying the address of the memory cell. The third circuit has a function of refreshing the memory cell at the address specified by the second circuit after the first circuit detects power-on. The memory cell preferably includes an oxide semiconductor transistor.

18 Claims, 15 Drawing Sheets

(51) Int. Cl.
  *H01L 29/78* (2006.01)
  *H01L 27/12* (2006.01)
  *H01L 27/10* (2006.01)
  *H01L 27/11* (2006.01)
  *G11C 11/56* (2006.01)
  *H01L 29/786* (2006.01)
  *H01L 27/108* (2006.01)
  *H01L 27/1156* (2017.01)

(52) U.S. Cl.
  CPC ........ *H01L 27/108* (2013.01); *H01L 27/1156* (2013.01); *H01L 27/12* (2013.01); *H01L 27/1207* (2013.01); *H01L 27/1225* (2013.01); *H01L 27/1255* (2013.01); *H01L 29/24* (2013.01); *H01L 29/7869* (2013.01)

(58) Field of Classification Search
  CPC ... H01L 27/12; H01L 29/786; H01L 27/1255; H01L 27/1207; H01L 29/7869; H01L 29/24
  See application file for complete search history.

(56) References Cited

U.S. PATENT DOCUMENTS

| | | |
|---|---|---|
| 5,744,864 A | 4/1998 | Cillessen et al. |
| 5,894,446 A * | 4/1999 | Itou ................. G11C 11/406 365/222 |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,406,038 B2 | 3/2013 | Saito et al. |
| 8,614,916 B2 | 12/2013 | Nagatsuka et al. |
| 9,001,563 B2 | 4/2015 | Atsumi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0067699 A1 * | 3/2007 | Koga .................. G06F 11/1048 714/763 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089927 A1 | 4/2011 | Yamazaki et al. |
| 2011/0199807 A1 * | 8/2011 | Saito .................... G11C 11/405 365/72 |
| 2012/0033488 A1 * | 2/2012 | Nagatsuka ......... G11C 16/0433 365/149 |
| 2012/0037972 A1 | 2/2012 | Yoneda |
| 2012/0039126 A1 | 2/2012 | Saito |
| 2012/0063208 A1 * | 3/2012 | Koyama ................ G11C 5/025 365/149 |
| 2012/0127781 A1 * | 5/2012 | Saito .................... G11C 11/404 365/149 |
| 2012/0236634 A1 | 9/2012 | Matsubayashi et al. |
| 2012/0314482 A1 * | 12/2012 | Takemura ............ G11C 11/403 365/149 |
| 2013/0148411 A1 | 6/2013 | Atsumi et al. |
| 2013/0196468 A1 * | 8/2013 | Yamazaki ......... H01L 29/66742 438/104 |
| 2013/0203214 A1 * | 8/2013 | Isobe .................. H01L 21/0237 438/104 |
| 2013/0207101 A1 | 8/2013 | Yamazaki et al. |
| 2013/0232366 A1 * | 9/2013 | Nishijima ............. G06F 1/3275 713/324 |
| 2013/0304982 A1 * | 11/2013 | Jung ................ G11C 11/40622 711/106 |
| 2014/0269099 A1 | 9/2014 | Nagatsuka et al. |

(56) References Cited

U.S. PATENT DOCUMENTS

| 2014/0286073 A1 | 9/2014 | Onuki |
| --- | --- | --- |
| 2015/0091629 A1 | 4/2015 | Ishizu et al. |
| 2015/0263008 A1 | 9/2015 | Atsumi et al. |
| 2015/0325708 A1 | 11/2015 | Yakubo et al. |
| 2015/0348608 A1 | 12/2015 | Matsuzaki et al. |
| 2015/0348609 A1 | 12/2015 | Ohmaru |

FOREIGN PATENT DOCUMENTS

| JP | 60-198861 A | 10/1985 |
| --- | --- | --- |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-256400 | 12/2012 |
| JP | 2013-168631 | 8/2013 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amporphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., The phase relations in the In2O3—Ga2ZnO4—ZnO system at 1350° C., Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistor Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistor by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

STORAGE DEVICE INCLUDING TRANSISTOR COMPRISING OXIDE SEMICONDUCTOR

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a storage device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

In recent years, with the increase in the amount of data manipulated, a semiconductor storage device having high storage capacity (hereinafter referred to as a storage device) has been required. A storage device is roughly classified into a volatile storage device that loses stored data when power is not supplied and a non-volatile storage device that retains stored data even when power is not supplied.

A typical example of a volatile storage device is a dynamic random access memory (DRAM). A DRAM stores data in such a manner that a transistor included in a storage element is selected and charge is accumulated in a capacitor. When data is read from a DRAM, charge in a capacitor is lost according to the principle; thus, another writing operation is necessary every time data is read. A transistor included in a storage element has leakage current (off-state current) or the like between a source and a drain in an off state and charge flows into or out even when the transistor is not selected, so that a data retention period is short. For that reason, another writing operation (refresh operation) is necessary at predetermined intervals, and it is difficult to sufficiently reduce power consumption.

A typical example of a nonvolatile storage device is a flash memory. A flash memory includes a floating gate between a gate electrode and a channel formation region of a transistor and stores data by holding charge in the floating gate. Thus, a flash memory has advantages in that a data retention period is extremely long (semi-permanent) and refresh operation which is necessary in a volatile storage device is not needed. However, a gate insulating layer included in a storage element deteriorates by tunneling current generated in writing, so that the storage element stops its function after a predetermined number of times of writing.

When a transistor including an oxide semiconductor in a channel formation region (hereinafter referred to as an oxide semiconductor transistor) is used as a switching element of a memory cell of a DRAM, the oxide semiconductor transistor has extremely low leakage current in an off state (off-state current); thus, a low-power DRAM having a low refresh frequency can be formed (Patent Document 1).

Patent Document 2 discloses a nonvolatile storage device including an oxide semiconductor transistor. Unlike the flash memory, the storage device has unlimited cycling capability, can easily operate at high speed because data is written by turning on or off the transistor, and consumes less power.

Patent Document 2 also discloses the structure of a storage device that stores multilevel data by using an oxide semiconductor transistor. In general, the allowable power fluctuation range of data in a multilevel memory is smaller than that of a binary memory, and small deterioration of data leads to memory malfunction. Thus, the secured data retention period of the multilevel memory is shorter than that of the binary memory.

REFERENCE

Patent Document 1: Japanese Published Patent Application No. 2013-168631
Patent Document 2: Japanese Published Patent Application No. 2012-256400

SUMMARY OF THE INVENTION

It is an object of one embodiment of the present invention to provide a highly reliable storage device. It is an object of one embodiment of the present invention to provide a storage device capable of writing data in a short time. It is an object of one embodiment of the present invention to provide a storage device that consumes less power in data writing. It is an object of one embodiment of the present invention to provide a highly reliable storage device capable of retaining multilevel data. It is an object of one embodiment of the present invention to provide a novel storage device. It is an object of one embodiment of the present invention to provide a novel semiconductor device.

Note that the description of a plurality of objects does not disturb the existence of each object. One embodiment of the present invention does not necessarily achieve all the objects described above. Other objects will be apparent from and can be derived from the description of the specification, the drawings, the claims, and the like, and such objects could be objects of one embodiment of the present invention.

One embodiment of the present invention is a storage device that includes a first circuit, a second circuit, a third circuit, and a memory cell. The first circuit has a function of detecting power-on. The second circuit has a function of specifying the address of the memory cell. The third circuit has a function of refreshing the memory cell at the address specified by the second circuit after the first circuit detects power-on. The memory cell includes a first transistor including an oxide semiconductor in a channel.

In the above embodiment, the memory cell may include a capacitor.

In the above embodiment, the memory cell may include a second transistor. Note that the channel of the second transistor preferably includes a semiconductor whose bandgap is narrower than a bandgap of the oxide semiconductor.

In the above embodiment, the memory cell preferably retains multilevel data.

In the above embodiment, the oxide semiconductor preferably contains indium, zinc, and M (M is Al, Ti, Ga, Y, Zr, La, Ce, Nd, or Hf).

An electronic device that includes at least one of a microphone, a speaker, a display portion, and an operation key preferably includes the storage device in the above embodiment.

One embodiment of the present invention can provide a highly reliable storage device. One embodiment of the present invention can provide a storage device capable of writing data in a short time. One embodiment of the present invention can provide a storage device that consumes less power in data writing. One embodiment of the present invention can provide a highly reliable storage device capable of retaining multilevel data. One embodiment of the present invention can provide a novel storage device. One embodiment of the present invention can provide a novel semiconductor device.

Note that the description of these effects does not disturb the existence of other effects. In one embodiment of the present invention, there is no need to obtain all the effects described above. Other effects will be apparent from and can be derived from the description of the specification, the drawings, the claims, and the like.

DETAILED DESCRIPTION OF THE INVENTION

Figure 1:
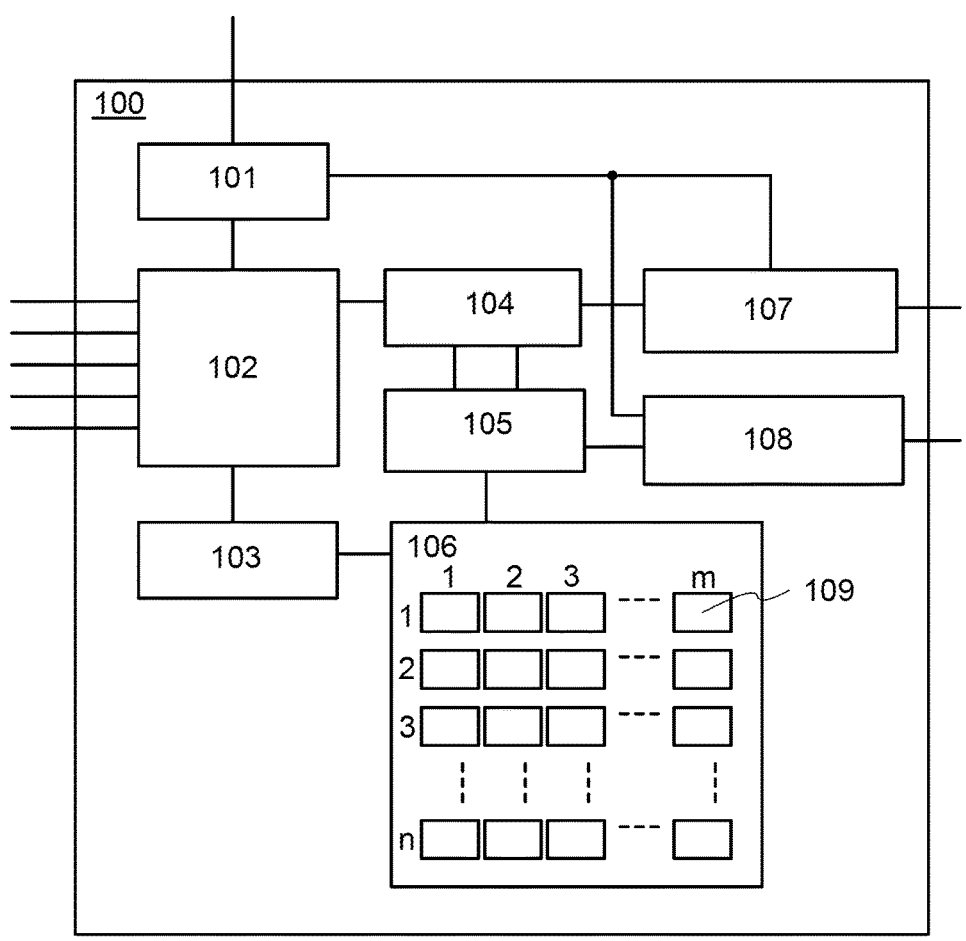
FIG. 1 is a block diagram illustrating a storage device structure example.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that in the structures of the invention described below, the same portions or portions having similar functions are denoted by the same reference numerals in different drawings, and description of such portions is not repeated. In some cases, the same hatching pattern is used for portions having similar functions, and the portions are not denoted by reference numerals.

Note that in each drawing described in this specification, the size, the layer thickness, or the region of each component is exaggerated for clarity in some cases. Therefore, embodiments of the present invention are not limited to such scales.

In this specification and the like, ordinal numbers such as "first" and "second" are used to avoid confusion among components, and thus do not limit the number of the components.

Note that a "semiconductor" includes characteristics of an "insulator" in some cases when conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

(Embodiment 1)

In this embodiment, an example of a storage device in one embodiment of the present invention is described with reference to FIG. 1, FIG. 2, and FIG. 3.

Data in a memory deteriorates due to leakage of charge held in the memory, for example. Thus, regular data refresh in the memory can prevent malfunction of the memory due to data deterioration.

Note that the term "refresh" means reading data stored in the memory and restoring the data to the memory.

Although it depends on usage environment, a user might power on a storage device once every few seconds, every few minutes, every few hours, or every few days under normal use. The storage device in one embodiment of the present invention has a function of refreshing the memory when the storage device is powered on.

FIG. 1 is a block diagram of circuits included in a storage device 100 in one embodiment of the present invention. The storage device 100 includes a controller 101, an address buffer 102, a row decoder 103, a column decoder 104, a read circuit 105, a memory 106, a data in buffer 107, and a data out buffer 108.

The memory 106 includes a plurality of memory cells 109 arranged in a matrix (m rows by n columns, where each of m and n is a natural number of two or more). Each of the memory cells 109 has a unique number (address). When the memory cell 109 holds charge, the memory 106 can store data.

The address buffer 102 has a function of outputting address data to the column decoder 104 and the row decoder 103 to select a specified address.

The row decoder 103 has a function of selecting a row corresponding to address data output from the address buffer 102.

The column decoder 104 has a function of selecting a column corresponding to address data output from the address buffer 102.

The read circuit 105 has a function of reading data in the memory 106. The read circuit 105 may include a sense amplifier or an analog digital converter (A/D converter). In addition, the read circuit 105 may have a function of temporarily storing data in the memory 106 by providing a page buffer. The storage device 100 can refresh the memory 106 on the basis of data stored in the page buffer.

The data in buffer 107 is used to input data input from an external circuit to the memory 106.

The data out buffer 108 is used to output data in the memory 106 to the external circuit. The page buffer may be provided in the data out buffer 108. Alternatively, the page buffer may be provided between the read circuit 105 and the data out buffer 108.

Figure 2:
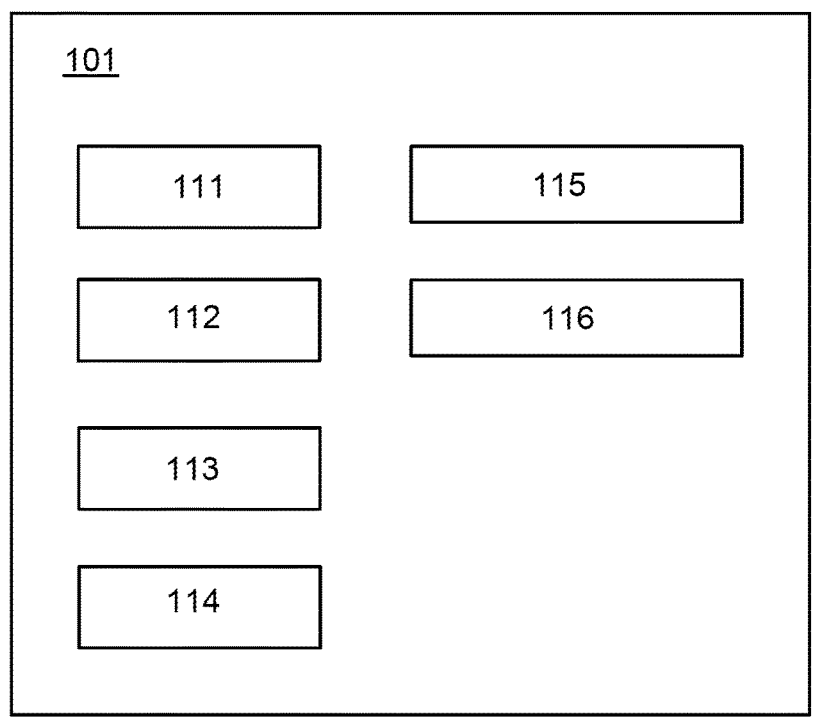
FIG. 2 is a block diagram illustrating a controller structure example.

FIG. 2 is a block diagram illustrating the circuit structure of the controller 101. The controller 101 includes a power-on detection circuit 111, a counter circuit 112, a mode selection circuit 113, an I/O control circuit 114, a refresh program circuit 115, and an address specification circuit 116.

The power-on detection circuit 111 has a function of detecting power-on of the storage device 100.

The counter circuit 112 has a function of sequentially selecting the addresses of the memory cells 109 to be refreshed.

The mode selection circuit 113 has a function of selecting possible states of the storage device 100, such as a refresh state, a standby state, a state of reading data from the memory 106, a state of writing data to the memory 106, and a power-off state, for example.

The I/O control circuit 114 has a function of switching data input/output of the storage device 100.

The refresh program circuit 115 has a function of refreshing the memory cell 109 at the address specified by the counter circuit 112 after the power-on detection circuit 111 detects power-on. Note that the refresh program circuit 115 may be provided outside the controller 101.

The address specification circuit 116 has a function of selecting the address of the memory cell 109.

When the storage device 100 is powered on, the power-on detection circuit 111 detects power-on, and the mode selection circuit 113 selects a refresh mode. When the refresh mode is selected, a program included in the refresh program circuit 115 is executed. In the refresh mode, the counter circuit 112 sequentially selects the addresses of the memory cells 109 and data in all or some of the memory cells 109 is refreshed.

Note that in refresh operation, data in the memory 106 needs to be read once. Data to be read may be temporarily stored in the page buffer.

Figure 3:
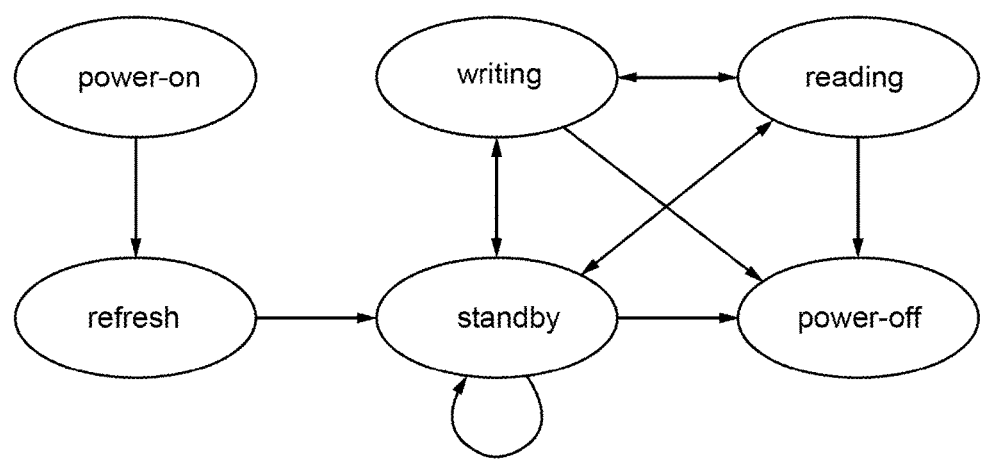
FIG. 3 is a state transition diagram illustrating possible state examples of a storage device.

FIG. 3 is a state transition diagram illustrating the operation of the storage device 100.

First, the storage device 100 is powered on, and then the storage device 100 moves to refresh operation.

Next, the storage device 100 moves to the standby state. The storage device 100 repeats the standby state until a new instruction is input.

In the case where a write instruction is input, the storage device 100 writes data to the memory 106.

In the case where a read instruction is input, the storage device 100 reads data from the memory 106.

Transition from the write operation to the read operation and transition from the read operation to the write operation may, but are not required to, go through the standby state.

In the case where a power-off instruction is input, the storage device 100 is powered off. The power-off operation may be transferred from the standby state, the write operation, or the read operation.

For example, in the case where a flash memory is used as the memory 106, all or some of the memory cells 109 in the flash memory are refreshed every power-on. However, deterioration of the memory cells 109 is accelerated because the number of times of writing in the flash memory is limited. In addition, the flash memory needs a long refresh time because it takes a long time to write data.

The memory cell 109 including an oxide semiconductor transistor is suitable for the memory 106 because it has an unlimited number of times of writing and it takes a short time to write data.

In addition, the memory cell 109 including an oxide semiconductor transistor is suitable for the memory 106 because it consumes less power in writing data.

In particular, the memory 106 is preferably a multilevel memory that can store data having two or more values. A storage device having high memory capacity can be provided by using a multilevel memory as the memory 106.

When the storage device 100 has such a structure, a highly reliable storage device with small data deterioration can be provided. In addition, a storage device having an unlimited number of times of writing and a short write time can be provided. Furthermore, a low-power storage device can be provided. Moreover, a storage device having high memory capacity can be provided.

The structures, methods, and the like described in this embodiment can be combined with any of the structures, methods, and the like described in the other embodiments as appropriate.

(Embodiment 2)

In this embodiment, an example of a transistor in one embodiment of the present invention is described.

<Structure Example 1 of Transistor>

Figure 4A:
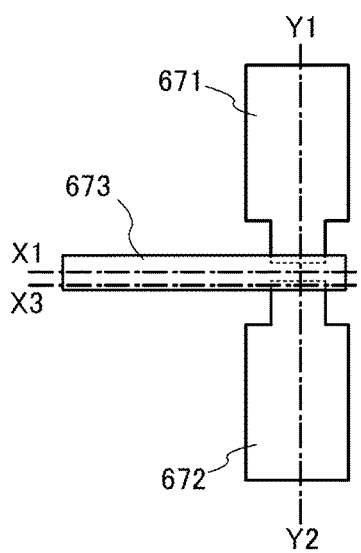
FIGS. 4A to 4D are a top view and cross-sectional views illustrating a transistor structure example.
Figure 4B:
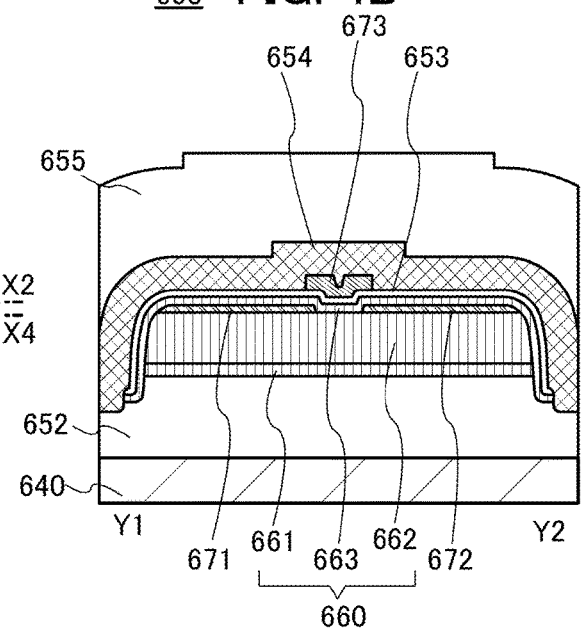
Figure 4C:
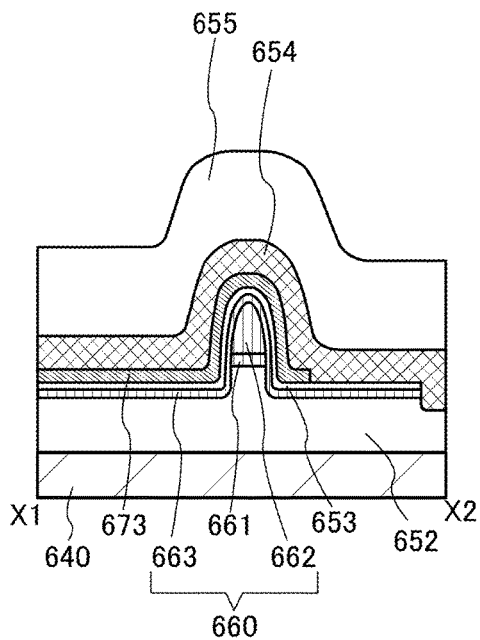
Figure 4D:
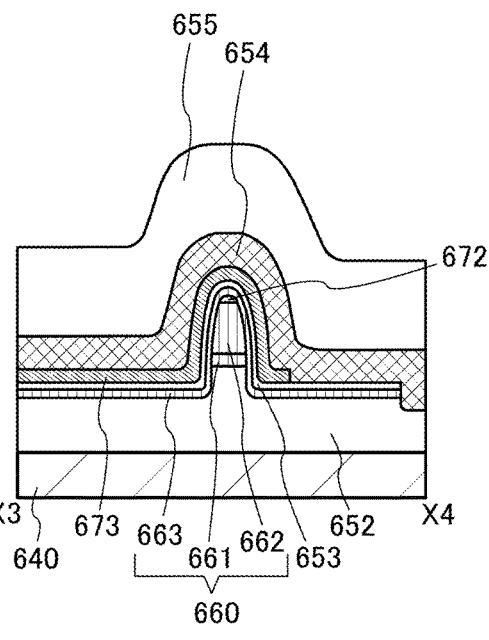

FIGS. 4A to 4D are a top view and cross-sectional views illustrating a transistor 600. FIG. 4A is the top view. FIG. 4B illustrates a cross section taken along dashed-dotted line Y1-Y2 in FIG. 4A. FIG. 4C illustrates a cross section taken along dashed-dotted line X1-X2 in FIG. 4A. FIG. 4D illustrates a cross section taken along dashed-dotted line X3-X4 in FIG. 4A. In FIGS. 4A to 4D, some components are scaled up or down or omitted for easy understanding. In some cases, the direction of dashed-dotted line Y1-Y2 is referred to as a channel length direction and the direction of dashed-dotted line X1-X2 is referred to as a channel width direction.

Note that the channel length refers to, for example, a distance between a source (a source region or a source electrode) and a drain (a drain region or a drain electrode) in a region where a semiconductor (or a portion where current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Accordingly, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, the term "channel width" may denote a surrounded channel width, i.e., an apparent channel width or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate field-effect mobility, a current value per channel width, and the like of a transistor. In this case, the obtained value is sometimes different from the value obtained by using an effective channel width for the calculation.

The transistor 600 includes a substrate 640; an insulating film 652 over the substrate 640; a layer in which semiconductors 661 and 662 are sequentially stacked over the insulating film 652; conductive films 671 and 672 in contact with a top surface of the semiconductor 662; a semiconductor 663 in contact with the semiconductors 661 and 662 and the conductive films 671 and 672; an insulating film 653 and a conductive film 673 over the semiconductor 663; an insulating film 654 over the conductive film 673 and the insulating film 653; and an insulating film 655 over the insulating film 654. Note that the semiconductors 661 to 663 are collectively referred to as a semiconductor 660.

The conductive film 671 functions as a source electrode of the transistor 600. The conductive film 672 functions as a drain electrode of the transistor 600. Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification.

The conductive film 673 functions as a gate electrode of the transistor 600.

The insulating film 653 functions as a gate insulating film of the transistor 600.

As illustrated in FIG. 4C, a side surface of the semiconductor 662 is surrounded by the conductive film 673. With such a structure, the semiconductor 662 can be electrically surrounded by an electric field of the conductive film 673 (a structure in which a semiconductor is electrically surrounded by an electric field of a conductive film (gate electrode) is referred to as a surrounded channel (s-channel) structure). Therefore, a channel is formed in the entire semiconductor 662 (bulk) in some cases. In the s-channel structure, a large amount of current can flow between a source and a drain of a transistor, so that high current in an on state (on-state current) can be achieved. The s-channel structure enables a transistor to operate at high frequency.

Since high on-state current can be obtained, the s-channel structure is suitable for a downsized transistor. A semiconductor device including the downsized transistor can have a high integration degree and high density. For example, the channel length of the transistor is preferably less than or equal to 100 nm, more preferably less than or equal to 60 nm, still more preferably less than or equal to 30 nm, and the channel width of the transistor is preferably less than or equal to 100 nm, more preferably less than or equal to 60 nm, still more preferably less than or equal to 30 nm.

Since high on-state current can be obtained, the s-channel structure is suitable for a transistor that needs to operate at high frequency. A semiconductor device including the transistor can operate at high frequency.

Components of the semiconductor device of this embodiment are described in detail below.

<Substrate>

As the substrate 640, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate can be used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate can be used. As the conductor substrate, a graphite substrate, a metal substrate, an alloy substrate, a conductive resin substrate, or the like can be used. A substrate including a metal nitride, a substrate including a metal oxide, or the like can be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. As the element provided over the substrate, a capacitor, a resistor, a switching element, a light-emitting element, a memory element, or the like can be used.

A flexible substrate may be used as the substrate 640. As a method for providing a transistor over a flexible substrate, there is a method in which a transistor is formed over a non-flexible substrate, and then the transistor is separated and transferred to the substrate 640 that is a flexible substrate. In that case, a separation layer is preferably provided between the non-flexible substrate and the transistor. As the substrate 640, a sheet, a film, or foil containing a fiber may be used. The substrate 640 may have elasticity. The substrate 640 may have a property of returning to its original shape when bending or pulling is stopped. Alternatively, the substrate 640 may have a property of not returning to its original shape. The thickness of the substrate 640 is, for example, greater than or equal to 5 μm and less than or equal to 700 μm, preferably greater than or equal to 10 μm and less than or equal to 500 µm, more preferably greater than or equal to 15 µm and less than or equal to 300 µm. When the substrate 640 has small thickness, the weight of the semiconductor device can be reduced. When the substrate 640 has small thickness, even in the case of using glass or the like, the substrate 640 may have elasticity or a property of returning to its original shape when bending or pulling is stopped. Therefore, an impact applied to the semiconductor device over the substrate 640, which is caused by dropping or the like, can be reduced. That is, a durable semiconductor device can be provided.

For the flexible substrate 640, metal, an alloy, resin, glass, or fiber thereof can be used, for example. The flexible substrate 640 preferably has a lower coefficient of linear expansion because deformation due to an environment is suppressed. The flexible substrate 640 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate 640 because of its low coefficient of linear expansion.

<Base Insulating Film>

It is preferable that the top surface of the insulating film 652 be planarized by chemical mechanical polishing (CMP) or the like.

The insulating film 652 preferably contains an oxide. In particular, the insulating film 652 preferably contains an oxide material from which part of oxygen is released by heating. The insulating film 652 preferably contains an oxide containing oxygen more than that in the stoichiometric composition. Part of oxygen is released by heating from an oxide film containing oxygen more than that in the stoichiometric composition. Oxygen released from the insulating film 652 is supplied to the semiconductor 660 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. As the metal oxide, aluminum oxide, aluminum oxynitride, gallium oxide, gallium oxynitride, yttrium oxide, yttrium oxynitride, hafnium oxide, hafnium oxynitride, or the like can be used. Note that in this specification, silicon oxynitride refers to a material that contains more oxygen than nitrogen, and silicon nitride oxide refers to a material that contains more nitrogen than oxygen.

In order that the insulating film 652 contains excess oxygen, a region containing excess oxygen may be formed by introduction of oxygen into the insulating film 652. For example, oxygen (including at least one of an oxygen radical, an oxygen atom, and an oxygen ion) is introduced into the insulating film 652 that has been formed, so that a region containing excess oxygen is formed. Oxygen can be introduced by ion implantation, ion doping, plasma immersion ion implantation, plasma treatment, or the like.

<Semiconductor>

Next, an oxide semiconductor that can be used as the semiconductors 661 to 663 is described.

As the transistor 600, a transistor having low current that flows between a source and a drain in an off state (low off-state current) is preferably used. Here, low off-state current means that normalized off-state current per micrometer of channel width at room temperature with a source-drain voltage of 10 V is lower than or equal to $10 \times 10^{-21}$ A. An example of a transistor with such low off-state current is a transistor including an oxide semiconductor as a semiconductor.

The semiconductor 662 is an oxide semiconductor containing indium (In), for example. The semiconductor 662 can have high carrier mobility (electron mobility) by containing indium, for example. The semiconductor 662 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 662 preferably contains zinc (Zn). When the oxide semiconductor contains zinc, the oxide semiconductor is easily to be crystallized in some cases.

Note that the semiconductor 662 is not limited to the oxide semiconductor containing indium. The semiconductor 662 may be, for example, an oxide semiconductor that does not contain indium and contains zinc, such as a zinc tin oxide or a gallium tin oxide, an oxide semiconductor containing gallium, or an oxide semiconductor containing tin.

For the semiconductor 662, an oxide with a wide energy gap is used. The energy gap of the semiconductor 662 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

A CAAC-OS film described later is preferably used for the semiconductor 662.

For example, the semiconductors 661 and 663 include one or more elements other than oxygen included in the semiconductor 662. Since the semiconductors 661 and 663 include one or more elements other than oxygen included in the semiconductor 662, an interface state is less likely to be formed at an interface between the semiconductors 661 and 662 and an interface between the semiconductors 662 and 663.

The semiconductors 661 to 663 preferably include at least indium. In the case of using an In-M-Zn oxide as the semiconductor 661, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. In the case of using an In-M-Zn oxide as the semiconductor 662, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. In the case of using an In-M-Zn oxide as the semiconductor 663, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. The semiconductor 663 may be an oxide that is the same type as that of the semiconductor 661. Note that the semiconductor 661 and/or the semiconductor 663 does not necessarily contain indium in some cases. For example, the semiconductor 661 and/or the semiconductor 663 may be gallium oxide.

In the case where the semiconductor 662 is an In-M-Zn oxide formed by sputtering, it is preferable that the atomic ratio of metal elements of a target used for depositing the In-M-Zn oxide be In:M:Zn=1:1:1, 3:1:2, or 4:2:4.1. Note that the atomic ratio of metal elements contained in a semiconductor film deposited using the sputtering target is different from that of the target. For example, the atomic ratio of metal elements contained in a semiconductor film deposited using a target of In:M:Zn=4:2:4.1 is approximately In:M:Zn=4:2:3.

In the case where each of the semiconductors 661 and 663 is an In-M-Zn oxide formed by sputtering, it is preferable that the atomic ratio of metal elements of a target used for depositing the In-M-Zn oxide be In:M:Zn=1:3:2 or 1:3:4. Note that the atomic ratio of metal elements contained in a semiconductor film deposited using the sputtering target is different from that of the target.

Figure 5A:
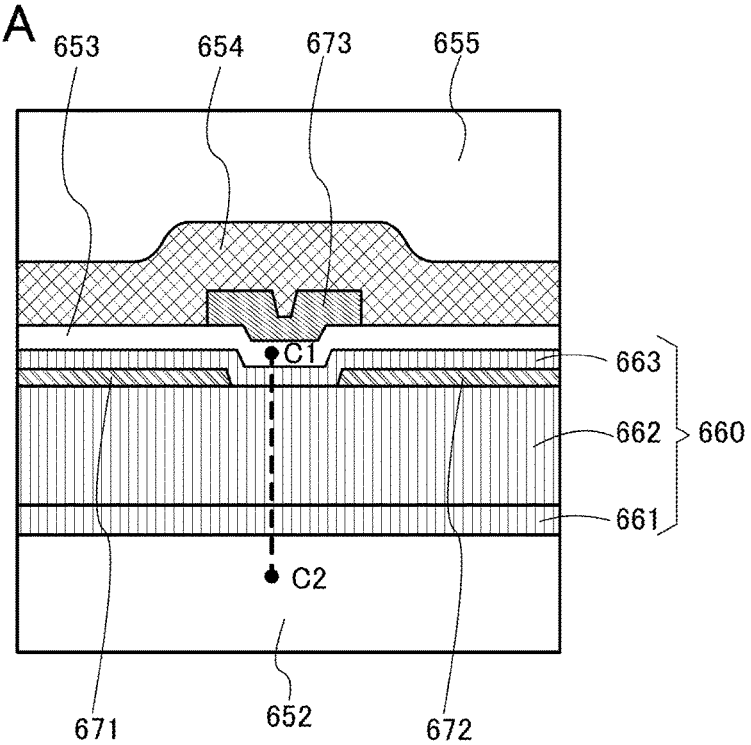
FIG. 5A is a cross-sectional view illustrating a transistor structure example.
Figure 5B:
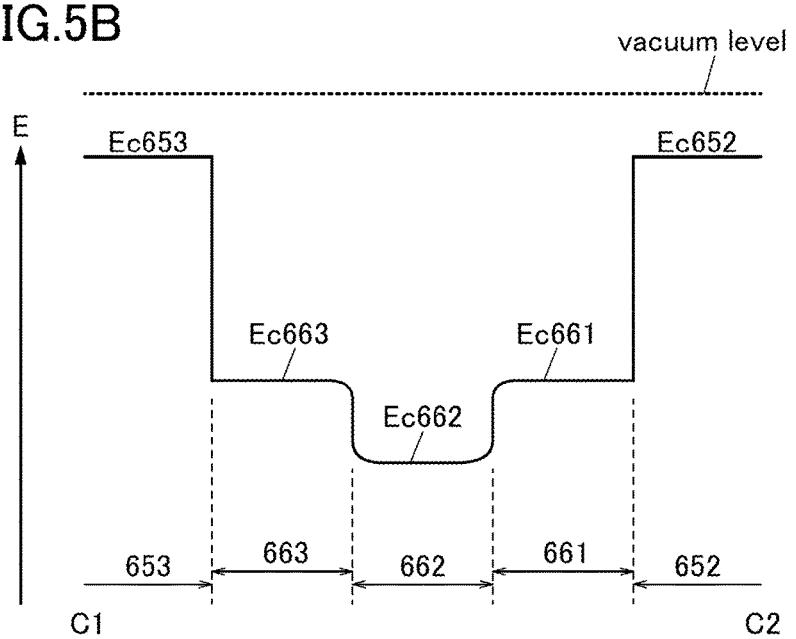
FIG. 5B is a band diagram of the transistor.

Next, a function and an effect of the semiconductor 660 in which the semiconductors 661 to 663 are stacked are described using an energy band diagram in FIG. 5B. FIG. 5A is an enlarged view of the channel portion of the transistor 600 illustrated in FIG. 4B. FIG. 5B shows the energy band structure of a portion taken along chain line C1-C2 in FIG. 5A. That is, FIG. 5B shows the energy band structure of a channel formation region of the transistor 600.

In FIG. 5B, Ec652, Ec661, Ec662, Ec663, and Ec653 indicate the energy of the conduction band minimum of the insulating film 652, the semiconductor 661, the semiconductor 662, the semiconductor 663, and the insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulating films 652 and 653 are insulators, Ec652 and Ec653 are closer to the vacuum level than Ec661 to Ec663 (i.e., the insulating films 652 and 653 have lower electron affinity than the semiconductors 661 to 663).

As the semiconductor 662, an oxide having an electron affinity higher than those of the semiconductors 661 and 663 is used. For example, as the semiconductor 662, an oxide having an electron affinity higher than those of the semiconductors 661 and 663 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that electron affinity is an energy gap between the vacuum level and the bottom of the conduction band.

An indium gallium oxide has low electron affinity and a high oxygen-blocking property. Therefore, the semiconductor 663 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the semiconductor 662 having the highest electron affinity in the semiconductors 661 to 663.

Here, in some cases, there is a mixed region of the semiconductors 661 and 662 between the semiconductors 661 and 662. Furthermore, in some cases, there is a mixed region of the semiconductors 662 and 663 between the semiconductors 662 and 663. The mixed region has low interface state density. For that reason, the stack of the semiconductors 661 to 663 has a band structure where energy at each interface is changed continuously (continuous junction).

At this time, electrons move mainly in the semiconductor 662, not in the semiconductors 661 and 663. As described above, when the interface state density at the interface between the semiconductors 661 and 662 and the interface state density at the interface between the semiconductors 662 and 663 are decreased, electron movement in the semiconductor 662 is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 μm×1 μm of a top surface or a bottom surface of the semiconductor 662 (a formation surface; here, the semiconductor 661) is less than 1 nm, preferably less than 0.6 nm, more preferably less than 0.5 nm, still more preferably less than 0.4 nm. The average surface roughness (Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 662 contains oxygen vacancies ($V_O$), donor levels are formed by entry of hydrogen into sites of oxygen vacancies in some cases. A state in which hydrogen enters sites of oxygen vacancies are denoted by $V_O H$ in the following description in some cases. $V_O H$ is a factor of decreasing the on-state current of the transistor because $V_O H$ scatters electrons. Note that sites of oxygen vacancies become more stable by entry of oxygen than by entry of hydrogen. Thus, by decreasing oxygen vacancies in the semiconductor 662, the on-state current of the transistor can be increased in some cases.

For example, at a certain depth in the semiconductor 662 or in a certain region of the semiconductor 662, the concentration of hydrogen measured by secondary ion mass spectrometry (SIMS) is set to be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

To decrease oxygen vacancies in the semiconductor 662, for example, there is a method in which excess oxygen in the insulating film 652 is moved to the semiconductor 662 through the semiconductor 661. In that case, the semiconductor 661 is preferably a layer having an oxygen-transmitting property (a layer through which oxygen is transmitted).

In the case where the transistor has an s-channel structure, a channel is formed in the entire semiconductor 662. Therefore, as the semiconductor 662 has larger thickness, a channel region becomes larger. In other words, the thicker the semiconductor 662 is, the larger the on-state current of the transistor is. For example, the semiconductor 662 has a region with a thickness of greater than or equal to 20 nm, preferably greater than or equal to 40 nm, more preferably greater than or equal to 60 nm, still more preferably greater than or equal to 100 nm. Note that the semiconductor 662 has a region with a thickness of, for example, less than or equal to 300 nm, preferably less than or equal to 200 nm, more preferably less than or equal to 150 nm because the productivity of the semiconductor device might be decreased.

Moreover, the thickness of the semiconductor 663 is preferably as small as possible to increase the on-state current of the transistor. For example, the semiconductor 663 has a region with a thickness of less than 10 nm, preferably less than or equal to 5 nm, more preferably less than or equal to 3 nm. Meanwhile, the semiconductor 663 has a function of blocking entry of elements other than oxygen (such as hydrogen and silicon) included in the adjacent insulator into the semiconductor 662 where a channel is formed. Thus, the semiconductor 663 preferably has a certain thickness. For example, the semiconductor 663 may have a region with a thickness of greater than or equal to 0.3 nm, preferably greater than or equal to 1 nm, more preferably greater than or equal to 2 nm. The semiconductor 663 preferably has an oxygen blocking property to inhibit outward diffusion of oxygen released from the insulating film 652 and the like.

To improve reliability, preferably, the thickness of the semiconductor 661 is large and the thickness of the semiconductor 663 is small. For example, the semiconductor 661 has a region with a thickness of greater than or equal to 10 nm, preferably greater than or equal to 20 nm, more preferably greater than or equal to 40 nm, still more preferably greater than or equal to 60 nm. When the thickness of the semiconductor 661 is made large, a distance from an interface between the adjacent insulator and the semiconductor 661 to the semiconductor 662 in which a channel is formed can be large. Note that the semiconductor 661 has a region with a thickness of, for example, less than or equal to 200 nm, preferably less than or equal to 120 nm, more preferably less than or equal to 80 nm because the productivity of the semiconductor device might be decreased.

For example, a region in which the concentration of silicon measured by SIMS is lower than $1\times10^{19}$ atoms/cm$^3$, preferably lower than $5\times10^{18}$ atoms/cm$^3$, more preferably lower than $2\times10^{18}$ atoms/cm$^3$ is provided between the semiconductors 661 and 662. A region in which the concentration of silicon measured by SIMS is lower than $1\times10^{19}$ atoms/cm$^3$, preferably lower than $5\times10^{18}$ atoms/cm$^3$, more preferably lower than $2\times10^{18}$ atoms/cm$^3$ is provided between the semiconductors 662 and 663.

It is preferable to reduce the concentration of hydrogen in the semiconductors 661 and 663 in order to reduce the concentration of hydrogen in the semiconductor 662. The semiconductors 661 and 663 each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductors 661 and 663 in order to reduce the concentration of nitrogen in the semiconductor 662. The semiconductors 661 and 663 each have a region in which the concentration of nitrogen measured by SIMS is lower than or equal to $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The above three-layer structure is an example. For example, a two-layer structure without the semiconductor 661 or 663 may be employed. A four-layer structure in which any one of the semiconductors described as examples of the semiconductors 661 to 663 is provided below or over the semiconductor 661 or below or over the semiconductor 663 may be employed. An n-layer structure (n is an integer of five or more) in which any one of the semiconductors described as examples of the semiconductors 661 to 663 is provided at two or more of the following positions: over the semiconductor 661, below the semiconductor 661, over the semiconductor 663, and below the semiconductor 663.

When the semiconductors 661 to 663 have the above structures, the transistor 600 can have high on-state current and operate at high frequency.

<Conductive Film>

The conductive films 671 to 673 preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr); an alloy of such a low-resistance material; or a compound containing such a material as its main component. It is particularly preferable to use a high-melting-point material that has heat resistance and conductivity, such as tungsten or molybdenum. The conductive films 671 to 673 are preferably formed using a low-resistance conductive material such as aluminum or copper. The conductive films 671 to 673 are particularly preferably formed using a Cu—Mn alloy because manganese oxide formed at the interface with an insulator containing oxygen has a function of preventing Cu diffusion.

The conductive films 671 to 673 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, the conductive films 671 to 673 can have a layered structure using the light-transmitting conductive material and the metal element.

The conductive films 671 to 673 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<Gate Insulating Film>

The insulating film 653 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 653 may be a stack of any of the above materials. Note that the insulating film 653 may contain lanthanum (La), nitrogen, zirconium (Zr), or the like as an impurity.

An example of a layered structure of the insulating film 653 is described. The insulating film 653 contains oxygen, nitrogen, silicon, or hafnium, for example. Specifically, the insulating film 653 preferably contains hafnium oxide and one of silicon oxide and silicon oxynitride.

Hafnium oxide has a higher dielectric constant than silicon oxide and silicon oxynitride. Therefore, by using hafnium oxide, the thickness can be larger than silicon oxide; thus, leakage current due to tunneling current can be low. That is, it is possible to provide a transistor with low off-state current.

<Protective Insulating Film>

The insulating film 654 has a function of blocking oxygen, hydrogen, water, alkali metal, alkaline earth metal, and the like. The insulating film 654 can prevent outward diffusion of oxygen from the semiconductor 660 and entry of hydrogen, water, or the like into the semiconductor 660 from the outside. The insulating film 654 can be a nitride insulating film, for example. Examples of the nitride insulating film include a silicon nitride film, a silicon nitride oxide film, an aluminum nitride film, and an aluminum nitride oxide film. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. Examples of the oxide insulating film having a blocking effect against oxygen, hydrogen, water, and the like include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 654 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the semiconductor 660, preventing release of oxygen, which is the main component of the semiconductor 660, from the oxide semiconductor, and preventing unnecessary release of oxygen from the insulating film 652. Furthermore, oxygen contained in the aluminum oxide film can be diffused into the oxide semiconductor.

<Interlayer Insulating Film>

The insulating film 655 is preferably formed over the insulating film 654. The insulating film 655 can be formed using an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, the insulating film 655 can be formed using an organic resin such as a polyimide resin, a polyamide resin, an acrylic resin, a siloxane resin, an epoxy resin, or a phenol resin. The insulating film 655 may be a stack of any of the above materials.

<Structure of Oxide Semiconductor Film>

The structure of an oxide semiconductor that can be used as the semiconductor 662 is described below.

In this specification, the term "parallel" indicates that an angle formed between two straight lines is greater than or equal to $-10°$ and less than or equal to $10°$, and accordingly includes the case where the angle is greater than or equal to $-5°$ and less than or equal to $5°$. In addition, the term "perpendicular" indicates that an angle formed between two straight lines is greater than or equal to $80°$ and less than or equal to $100°$, and accordingly includes the case where the angle is greater than or equal to $85°$ and less than or equal to $95°$.

In this specification, trigonal and rhombohedral crystal systems are included in a hexagonal crystal system.

An oxide semiconductor film is roughly classified into a non-single-crystal oxide semiconductor film and a single-crystal oxide semiconductor film. The non-single-crystal oxide semiconductor film means any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2 θ) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

As in the CAAC-OS film, the state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

Note that in this specification and the like, the carrier density of a substantially purified oxide semiconductor film is lower than $1\times10^{17}/cm^3$, lower than $1\times10^{15}/cm^3$, or lower than $1\times10^{13}/cm^3$. With a highly purified intrinsic oxide semiconductor film, the transistor can have stable electrical characteristics.

In order to make the oxide semiconductor film intrinsic or substantially intrinsic, for example, the concentration of silicon at a certain depth of the oxide semiconductor film or in a region of the oxide semiconductor film, which is measured by SIMS, is lower than $1\times10^{19}$ atoms/cm$^3$, preferably lower than $5\times10^{18}$ atoms/cm$^3$, more preferably lower than $1\times10^{18}$ atoms/cm$^3$. The concentration of hydrogen at a certain depth of the oxide semiconductor film or in a region of the oxide semiconductor film is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen at a certain depth of the oxide semiconductor film or in a region of the oxide semiconductor film is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In addition, in the case where the oxide semiconductor includes a crystal, high concentration of silicon or carbon might reduce the crystallinity of the oxide semiconductor. In order not to reduce the crystallinity of the oxide semiconductor, for example, the concentration of silicon at a certain depth of the oxide semiconductor or in a region of the oxide semiconductor is lower than $1\times10^{19}$ atoms/cm$^3$, preferably lower than $5\times10^{18}$ atoms/cm$^3$, more preferably lower than $1\times10^{18}$ atoms/cm$^3$. Furthermore, the concentration of carbon at a certain depth of the oxide semiconductor or in a region of the oxide semiconductor is lower than $1\times10^{19}$ atoms/cm$^3$, preferably lower than $5\times10^{18}$ atoms/cm$^3$, more preferably lower than $1\times10^{18}$ atoms/cm$^3$, for example.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Even when the oxide semiconductor film is a CAAC-OS film, a diffraction pattern similar to that of an nc structure or the like is partly observed in some cases. Therefore, the quality of a CAAC-OS film can be sometimes represented by the proportion of a region where a diffraction pattern of a CAAC-OS structure is observed in a predetermined area (also referred to as CAAC proportion). The CAAC proportion is preferably higher than or equal to 90%, more preferably higher than or equal to 95%, still more preferably higher than or equal to 97% and lower than or equal to 100%.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

Note that an oxide semiconductor film may be a stacked film including two or more films of an amorphous oxide semiconductor film, an amorphous-like OS film, a microcrystalline oxide semiconductor film, and a CAAC-OS film, for example.

Composition of a CAAC-OS is described below. For explanation of the composition, an In-M-Zn oxide that is an oxide semiconductor to be a CAAC-OS is described as an example. The element M is aluminum, gallium, yttrium, tin, or the like. Other elements that can be used as the element M are boron, silicon, titanium, iron, nickel, germanium, yttrium, zirconium, molybdenum, lanthanum, cerium, neodymium, hafnium, tantalum, tungsten, and the like.

Figure 15:
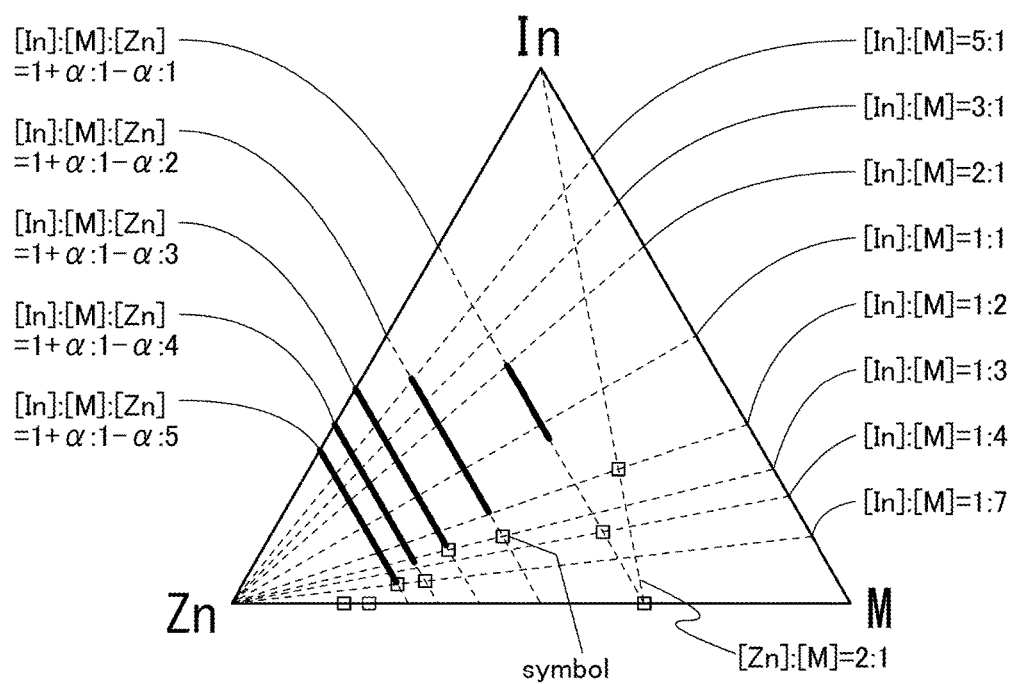
FIG. 15 is a triangular diagram showing composition of an In-M-Zn oxide.

FIG. 15 is a triangular diagram in which the vertices represent In, M, and Zn. In the diagram, [In] means the atomic concentration of In, [M] means the atomic concentration of the element M, and [Zn] means the atomic concentration of Zn.

A crystal of an In-M-Zn oxide is known to have a homologous structure and is represented by InMO$_3$(ZnO)$_m$ (m is a natural number). Since In and M can be interchanged, the crystal can also be represented by In$_{1+\alpha}$M$_{1-\alpha}$O$_3$(ZnO)$_m$. This composition is represented by any of dashed lines denoted as [In]:[M]:[Zn]=1+α:1−α:1, [In]:[M]:[Zn]=1+α:1−α:2, [In]:[M]:[Zn]=1+α:1−α:3, [In]:[M]:[Zn]=1+α:1−α:4, and [In]:[M]:[Zn]=1+α:1−α:5 in FIG. 15.

It is known that thick lines on the dashed lines in FIG. 15 indicate compositions which allow a single-phase solid solution range when oxides (raw materials) are mixed and sintered at 1350° C., for example. Coordinates denoted by square symbols in FIG. 15 correspond to known compositions with which a spinel crystal structure is likely to be mixed.

For example, a compound represented by ZnM$_2$O$_4$, such as ZnGa$_2$O$_4$, is known as a compound having a spinel crystal structure, for example. When the composition is in the neighborhood of ZnM$_2$O$_4$, that is, the composition is close to (In, Zn, M)=(0, 1, 2) as shown in FIG. 15, a spinel crystal structure is likely to be formed or mixed. Furthermore, it is particularly preferable that the CAAC-OS film have no spinel crystal structure.

In addition, to increase carrier mobility, the indium content is preferably increased. In an oxide semiconductor containing indium, the element M, and zinc, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, so that carrier mobility can be increased.

The composition of the semiconductor 662 in FIGS. 4A to 4D is preferably in the neighborhood of the composition represented by the thick line in FIG. 15. When such a composition is employed, the channel formation region of the transistor can have a high proportion of CAAC. Furthermore, in the case where the indium content in the semiconductor 662 is increased, the on-state current of the transistors can be increased. Among the compositions of the semiconductor 662 that satisfy the above condition, In:M:Zn=4:2:3 (the atomic ratio of metal elements) is particularly preferable.

When the channel formation region of the transistor includes a CAAC-OS as described above, a transistor having high reliability and high on-state current can be provided. In addition, a transistor capable of operating at high frequency can be provided.

When a CAAC-OS is deposited by sputtering, because of heating of a substrate surface (the surface on which the CAAC-OS is deposited), space heating, or the like, the composition of the film is sometimes different from that of a target as a source or the like. For example, since zinc oxide sublimates more easily than indium oxide, gallium oxide, or the like, the source and the film are likely to have different compositions. Thus, a source is preferably selected taking into account the change in composition. Note that a difference between the compositions of the source and the film is also affected by pressure or gas used for the deposition as well as temperature.

In the case where the CAAC-OS is deposited by sputtering, a target including a polycrystalline structure is preferably used.

<Structure Example 2 of Transistor>

Figure 6A:
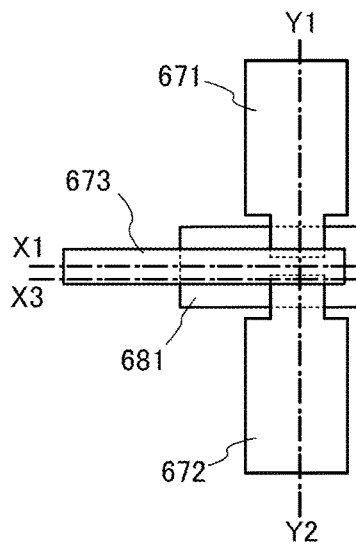
FIGS. 6A to 6D are a top view and cross-sectional views illustrating a transistor structure example.
Figure 6B:
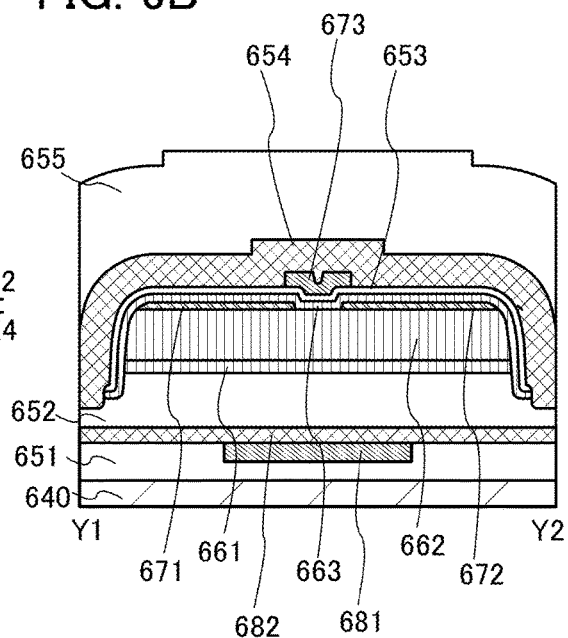
Figure 6C:
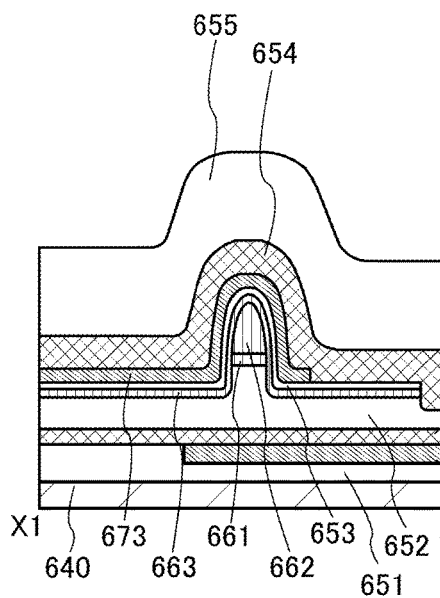
Figure 6D:
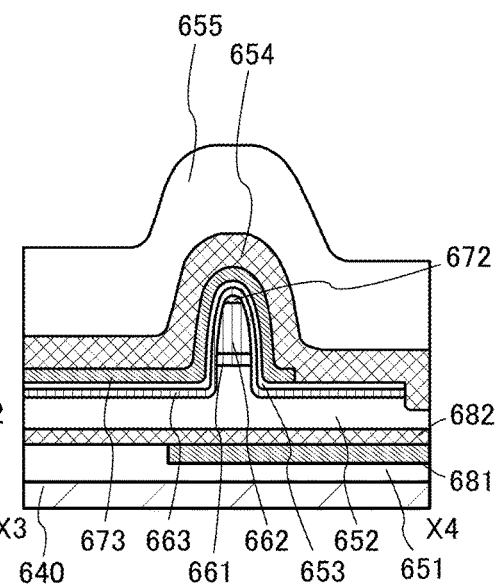

Although the example where one gate electrode is provided in the transistor is illustrated in FIGS. 4A to 4D, one embodiment of the present invention is not limited thereto. A plurality of gate electrodes may be provided in the transistor. FIGS. 6A to 6D illustrate an example where the transistor 600 in FIGS. 4A to 4D is provided with a conductive film 681 as a second gate electrode. FIG. 6A is a top view. FIG. 6B illustrates a cross section taken along dashed-dotted line Y1-Y2 in FIG. 6A. FIG. 6C illustrates a cross section taken along dashed-dotted line X1-X2 in FIG. 6A. FIG. 6D illustrates a cross section taken along dashed-dotted line X3-X4 in FIG. 6A. In FIGS. 6A to 6D, some components are scaled up or down or omitted for easy understanding.

FIGS. 6A to 6D differ from FIGS. 4A to 4D in that an insulating film 651, the conductive film 681, and an insulating film 682 are provided between the substrate 640 and the insulating film 652.

The insulating film 651 has a function of electrically isolating the substrate 640 and the conductive film 681 from each other. The insulating film 651 may be formed using an insulator containing one or more of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating film 651 may be formed using an organic resin such as a polyimide resin, a polyamide resin, an acrylic resin, a siloxane resin, an epoxy resin, or a phenol resin. The insulating film 651 may be a stack of any of the above materials.

Any of the materials that can be used for the conductive film 673 can be used for the conductive film 681. The conductive film 681 functions as a second gate electrode. The conductive film 681 may be supplied with a constant potential, or a potential or a signal that is the same as that supplied to the conductive film 673.

The insulating film 682 has a function of preventing oxygen contained in the insulating film 652 from decreasing by bonding to metal contained in the conductive film 681. Any of the materials that can be used for the insulating film 654 can be used for the insulating film 682.

<Structure Example 3 of Transistor>

Figure 7A:
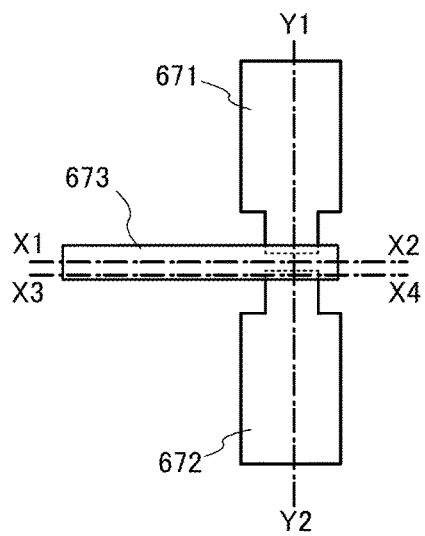
FIGS. 7A to 7D are a top view and cross-sectional views illustrating a transistor structure example.
Figure 7B:
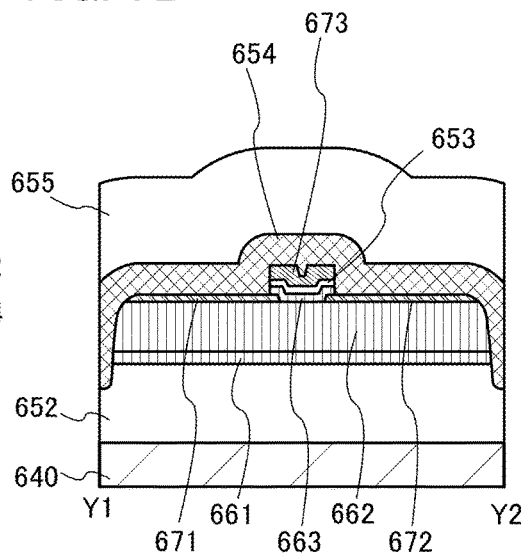
Figure 7C:
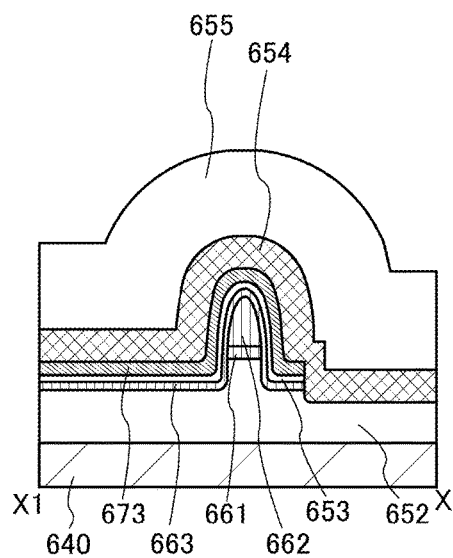
Figure 7D:
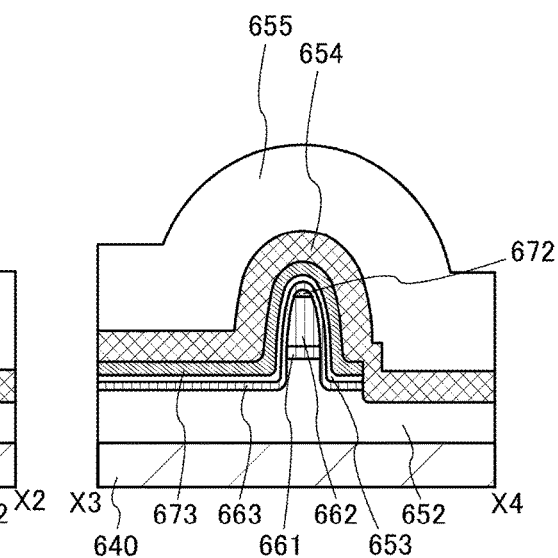

In the transistor 600 in FIGS. 4A to 4D, the semiconductor 663 and the insulating film 653 may be etched at the same time as the conductive film 673. FIGS. 7A to 7D illustrate an example. FIG. 7A is a top view. FIG. 7B illustrates a cross section taken along dashed-dotted line Y1-Y2 in FIG. 7A. FIG. 7C illustrates a cross section taken along dashed-dotted line X1-X2 in FIG. 7A. FIG. 7D illustrates a cross section taken along dashed-dotted line X3-X4 in FIG. 7A. In FIGS. 7A to 7D, some components are scaled up or down or omitted for easy understanding.

In FIGS. 7A to 7D, the semiconductor 663 and the insulating film 653 are provided only below the conductive film 673 and are removed in other regions.

<Structure Example 4 of Transistor>

Figure 8A:
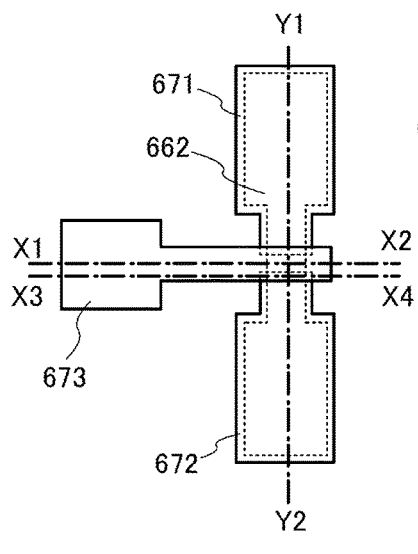
FIGS. 8A to 8D are a top view and cross-sectional views illustrating a transistor structure example.
Figure 8B:
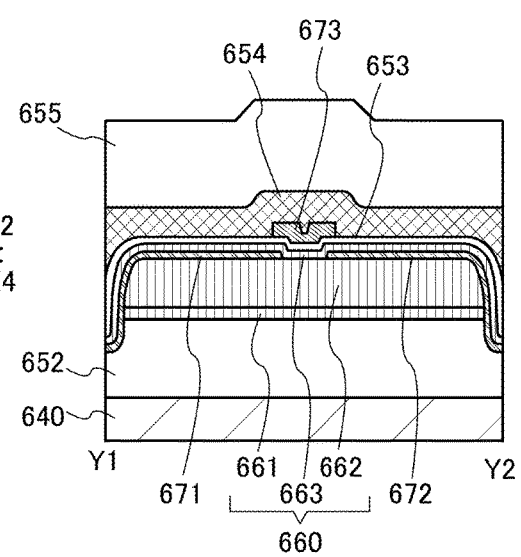
Figure 8C:
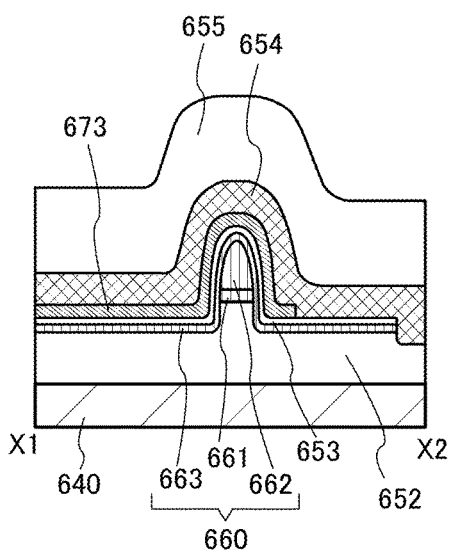
Figure 8D:
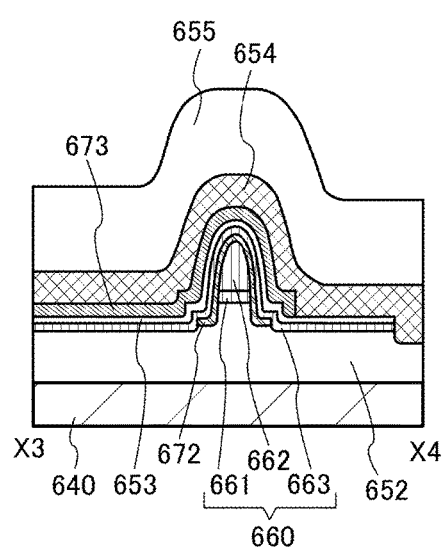

In the transistor 600 in FIGS. 4A to 4D, the conductive films 671 and 672 may be in contact with side surfaces of the semiconductors 661 and 662. FIGS. 8A to 8D illustrate an example. FIG. 8A is a top view. FIG. 8B illustrates a cross section taken along dashed-dotted line Y1-Y2 in FIG. 8A. FIG. 8C illustrates a cross section taken along dashed-dotted line X1-X2 in FIG. 8A. FIG. 8D illustrates a cross section taken along dashed-dotted line X3-X4 in FIG. 8A. In FIGS. 8A to 8D, some components are scaled up or down or omitted for easy understanding.

The structures, the methods, and the like described in this embodiment can be combined with any of the structures, the methods, and the like described in the other embodiments as appropriate.

(Embodiment 3)

In this embodiment, an example of a storage device applicable to one embodiment of the present invention is described with reference to drawings. The storage device can retain stored data even when power is not supplied and has an unlimited number of write cycles.

Figure 9A:
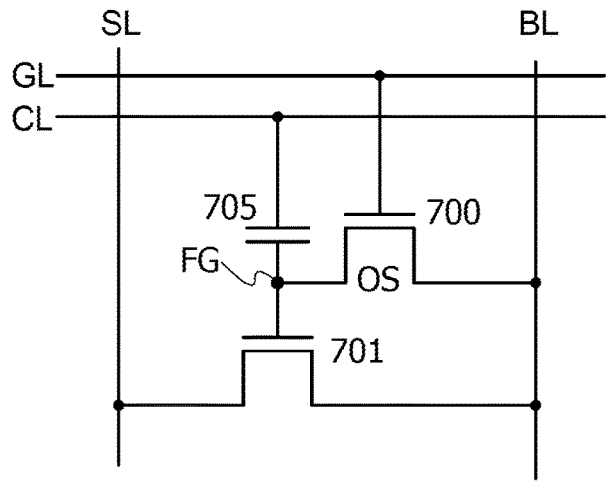
FIGS. 9A to 9C are circuit diagrams each illustrating a semiconductor device example.

The circuit in FIG. 9A can function as a memory cell. The memory cell in FIG. 9A includes a transistor 701 formed using a first semiconductor material, a transistor 700 formed using a second semiconductor material, and a capacitor 705. As the transistor 700, the transistor described in Embodiment 2 can be used.

The transistor 700 is an n-channel transistor in which a channel is formed in a semiconductor layer including an oxide semiconductor. Since the off-state current of the transistor 700 is low, stored data can be retained for a long time owing to such a transistor. In other words, a storage device in which refresh operation is not needed or the frequency of refresh operation is extremely low can be provided, which results in a sufficient reduction in power consumption.

In FIG. 9A, the transistor 701 is an n-channel transistor.

In FIG. 9A, a wiring SL is electrically connected to one of a source and a drain of the transistor 701. A wiring BL is electrically connected to the other of the source and the drain of the transistor 701. The wiring BL is also electrically connected to one of a source and a drain of the transistor 700. A wiring GL is electrically connected to a gate of the transistor 700. A gate of the transistor 701, the other of the source and the drain of the transistor 700, and a first terminal of the capacitor 705 are electrically connected to a node FG. A wiring CL is electrically connected to a second terminal of the capacitor 705.

The memory cell in FIG. 9A utilizes a characteristic in which the potential of the gate of the transistor 701 can be retained, so that data can be written, retained, and read as follows.

Data writing and data retention are described. First, the potential of the wiring GL is set to a potential at which the transistor 700 is turned on, so that the transistor 700 is turned on. Accordingly, the potential of the wiring BL is supplied to the node FG. That is, predetermined charge is supplied to the node FG (writing). Here, charge for supplying either of two different potential levels (hereinafter referred to as low-level charge and high-level charge) is given. After that, the potential of the wiring GL is set to a potential at which the transistor 700 is turned off, so that the transistor 700 is turned off. Thus, the charge given to the node FG is held (storing).

Since the off-state current of the transistor 700 is extremely low, the charge of the gate of the transistor 701 is held for a long time.

Next, data reading is described. An appropriate potential (reading potential) is supplied to the wiring CL after a predetermined potential (constant potential) is supplied to the wiring SL to make the wiring BL electrically floating, so that current flows from the wiring SL to the wiring BL and the potential of the wiring BL is changed. This is because in the case where the transistor 701 is an n-channel transistor, apparent threshold voltage $V_{th\_H}$ of the transistor 701 when high-level charge is supplied to the node FG is usually lower than apparent threshold voltage $V_{th\_L}$ of the transistor 701 when low-level charge is supplied to the node FG. Apparent threshold voltage refers to the potential of the wiring CL that is needed to turn on the transistor 701. Thus, when the potential of the wiring CL is set to a potential $V_0$ that is between $V_{th\_H}$ and $V_{th\_L}$, charge given to the gate of the transistor 701 can be determined. For example, in the case where the high-level charge is given in data writing, the transistor 701 is turned on when the potential of the wiring CL is $V_0$ ($>V_{th\_H}$). In the case where the low-level charge is given in data writing, the transistor 701 remains in an off state even when the potential of the wiring CL is set to $V_0$ ($<V_{th\_L}$). Therefore, the retained data can be read by determining the potential of the wiring BL.

Note that in the case where memory cells are arrayed, only data in a desired memory cell needs to be read. In the case where such data reading is not performed, the wiring CL may be supplied with a potential at which the transistor 701 is turned off regardless of the state of the gate, that is, a potential lower than $V_{th\_H}$. Alternatively, the wiring CL may be supplied with a potential at which the transistor 701 is turned on regardless of the state of the gate, that is, a potential higher than $V_{th\_L}$.

Figure 9B:
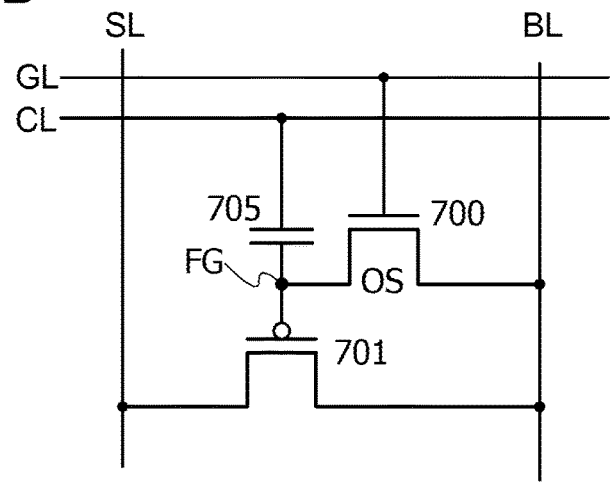

As illustrated in FIG. 9B, the transistor 701 may be a p-channel transistor.

Figure 9C:
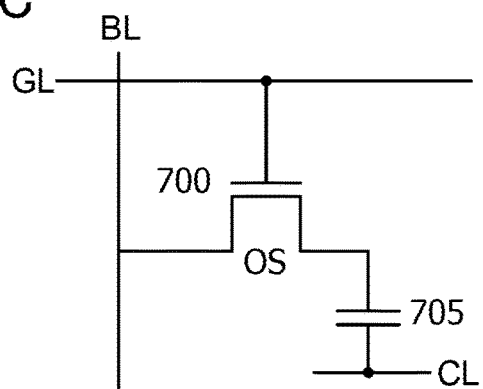

The memory cell in FIG. 9C differs from the memory cells in FIGS. 9A and 9B in that the transistor 701 is not provided. Also in this case, data can be written and retained in a manner similar to the above.

Next, data reading from the memory cell in FIG. 9C is described. When the transistor 700 is turned on, the wiring BL that is in a floating state and the capacitor 705 are electrically connected to each other, and the charge is redistributed between the wiring BL and the capacitor 705. As a result, the potential of the wiring BL is changed. The amount of change in the potential of the wiring BL varies depending on the potential of the first terminal of the capacitor 705 (or the charge accumulated in the capacitor 705).

For example, the potential of the wiring BL after the charge redistribution is $(C_B \times V_{B0} + C \times V)/(C_B + C)$, where V is the potential of the first terminal of the capacitor 705, C is the capacitance of the capacitor 705, $C_B$ is the capacitance component of the wiring BL, and $V_{B0}$ is the potential of the wiring BL before the charge redistribution. Thus, it can be found that, assuming that the memory cell is in either of two states in which the potential of the first terminal of the capacitor 705 is $V_1$ and $V_0$ ($V_1 > V_0$), the potential of the wiring BL when the potential $V_1$ is held ($=(C_B \times V_{B0} + C \times V_1)/(C_B + C)$) is higher than the potential of the wiring BL when the potential $V_0$ is held ($=(C_B \times V_{B0} + C \times V_0)/(C_B + C)$).

Then, by comparing the potential of the wiring BL with a predetermined potential, data can be read.

In this case, a transistor including the first semiconductor material may be used in a driver circuit for driving a memory cell, and a transistor including the second semiconductor material may be stacked over the driver circuit as the transistor 700.

In this embodiment, when a transistor having a channel formation region formed using an oxide semiconductor and having extremely low off-state current is employed in the memory cell, stored data can be retained for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

In addition, the memory cell in this embodiment does not require high voltage for writing data and does not have the problem of deterioration of elements. For example, unlike a conventional nonvolatile memory, it is not necessary to inject and extract electrons into and from a floating gate; thus, a problem such as deterioration of a gate insulating film does not arise. In other words, the semiconductor device in the disclosed invention does not have a limit on the number of write cycles that is a problem in a conventional nonvolatile memory, and reliability thereof is drastically improved. Furthermore, data is written depending on the on state and the off state of the transistor, so that high-speed operation can be easily achieved.

Figure 10:
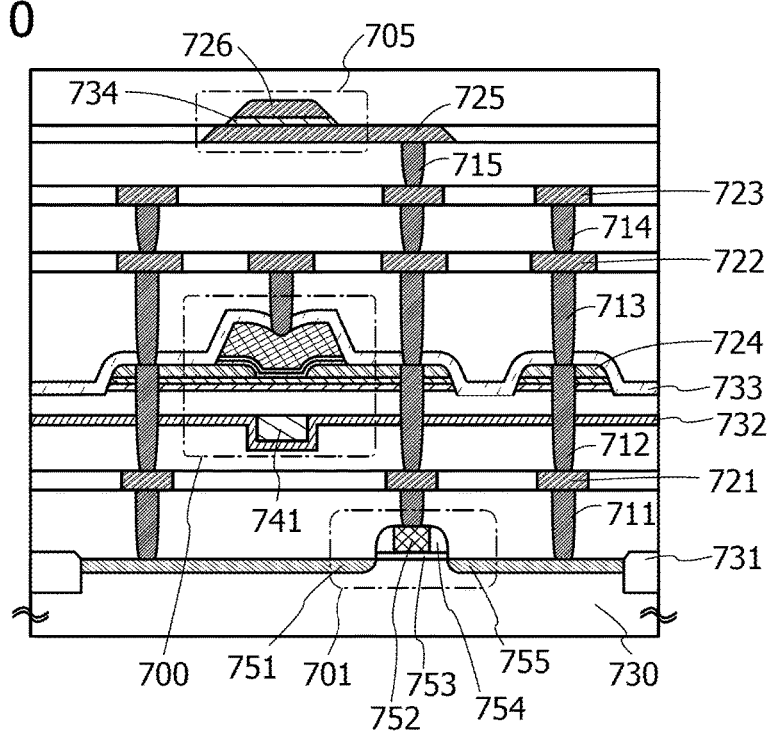
FIG. 10 is a cross-sectional view illustrating a semiconductor device structure example.

FIG. 10 is a cross-sectional view illustrating a structure example of the semiconductor device in FIG. 9A. FIG. 10 illustrates the cross-sectional structure of each transistor in a channel length direction.

The semiconductor device in FIG. 10 includes the transistors 700 and 701, the capacitor 705, a substrate 730, an element isolation layer 731, insulating films 732 and 733, plugs 711 to 715, and wirings 721, 722, 723, 724, and 741. Note that in the case where a reference numeral is given to one component in FIG. 10, a reference numeral is not given to the same component formed in the same layer as the one component to avoid complexity.

As the transistor 700, the transistor described in Embodiment 2 can be used.

The transistor 701 includes impurity regions 751 and 755 functioning as a source region and a drain region, a gate electrode 752, a gate insulating film 753, and a sidewall insulating layer 754.

The transistor 701 and includes a first semiconductor material, and the transistor 700 includes a second semiconductor material. The first semiconductor material and the second semiconductor material preferably have different band gaps. For example, the first semiconductor material can be a semiconductor material other than an oxide semiconductor (such as silicon (including strained silicon), germanium, silicon germanium, silicon carbide, gallium arsenide, aluminum gallium arsenide, indium phosphide, gallium nitride, or an organic semiconductor), and the second semiconductor material can be an oxide semiconductor. A transistor including a material other than an oxide semiconductor, such as single crystal silicon, can operate at high speed easily. In contrast, a transistor including an oxide semiconductor and described in Embodiment 2 as an example can have excellent subthreshold characteristics and a minute structure. Furthermore, the transistor can operate at high speed because of its high switching speed and has low leakage current because of its low off-state current.

The transistor 701 may be either an n-channel transistor or a p-channel transistor, and an appropriate transistor may be used depending on a circuit.

Moreover, the transistor 701 may include an impurity region functioning as a lightly doped drain (LDD) region or an extension region below the sidewall insulating layer 754. In particular, when the transistor 701 is an n-channel transistor, the LDD region or the extension region is preferably provided to suppress deterioration due to hot carriers.

As each of the transistor 701, a transistor containing silicide (salicide) or a transistor that does not include the sidewall insulating layer 754 may be used. When a structure that contains silicide (salicide) is used, the resistance of the source region and the drain region can be further lowered and the speed of the semiconductor device can be increased. Furthermore, the semiconductor device can be operated at low voltage; thus, power consumption of the semiconductor device can be reduced.

The wiring 741 functions as a second gate of the transistor 700; however, the wiring 741 may be omitted according to circumstances.

The capacitor 705 includes a first electrode 725, a second electrode 726, and an insulating film 734.

A single crystal semiconductor substrate or a polycrystalline semiconductor substrate of silicon or silicon carbide, a compound semiconductor substrate of silicon germanium, a silicon-on-insulator (SOI) substrate, or the like can be used as the substrate 730. A transistor formed using a semiconductor substrate can operate at high speed easily. Note that in the case where a p-type single crystal silicon substrate is used as the substrate 730, an impurity element imparting n-type conductivity may be added to part of the substrate 730 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

For example, a glass substrate, a quartz substrate, a plastic substrate, a metal substrate, a flexible substrate, an attachment film, paper including a fibrous material, a base film, or the like may be used as the substrate 730. Examples of a glass substrate include a barium borosilicate glass substrate, an aluminoborosilicate glass substrate, and a soda lime glass substrate. Examples of a metal substrate include a stainless steel substrate, a substrate including stainless steel foil, a tungsten substrate, and a substrate including tungsten foil. Examples of a flexible substrate include a flexible synthetic resin such as plastics typified by polyethylene terephthalate (PET), polyethylene naphthalate (PEN), and polyethersulfone (PES), and acrylic. Examples of an attachment film include attachment films formed using polypropylene, polyester, polyvinyl fluoride, and polyvinyl chloride. Examples of a base material film include films formed using polyester, polyamide, polyimide, aramid, epoxy, an inorganic vapor deposition film, and paper.

Note that a semiconductor element may be formed using one substrate and then transferred to another substrate. Examples of a substrate to which a semiconductor element is transferred include, in addition to the above-described substrates, a cellophane substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), and the like), a leather substrate, and a rubber substrate. When such a substrate is used, a transistor with excellent properties or a transistor with low power consumption can be formed, a device with high durability or high heat resistance can be provided, or reduction in weight or thickness can be achieved.

The transistor 701 is isolated from other transistors formed on the substrate 730 by the element isolation layer 731. The element isolation layer 731 can be formed using an insulator containing one or more materials selected from aluminum oxide, aluminum oxynitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, tantalum oxide, and the like.

The wiring 741 may be formed using a material that can be used for the wirings 721 to 723. Note that the wiring 741 may be omitted according to circumstances. The wiring 724 can be formed using the same material as the source and the drain of the transistor 700.

Here, in the case where a silicon-based semiconductor material is used for the transistor 701 provided in a lower portion, hydrogen in an insulating film provided in the vicinity of the semiconductor films of the transistor 701 terminates dangling bonds of silicon; accordingly, the reliability of the transistor 701 can be improved. Meanwhile, in the case where an oxide semiconductor is used for the transistor 700 provided in an upper portion, hydrogen in an insulating film provided in the vicinity of the semiconductor film of the transistor 700 becomes a factor of generating carriers in the oxide semiconductor; thus, the reliability of the transistor 700 might be decreased. Therefore, in the case where the transistor 700 using an oxide semiconductor is stacked over the transistor 701 using a silicon-based semiconductor material, it is particularly effective that the insulating film 732 having a function of preventing diffusion of hydrogen is provided between the transistor 700 and the transistor 701. The insulating film 732 makes hydrogen remain in the lower portion, so that the reliability of the transistor 701 can be increased. In addition, since the insulating film 732 inhibits diffusion of hydrogen from the lower portion to the upper portion, the reliability of the transistor 700 can also be increased.

The insulating film 723 can be formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ), for example.

Furthermore, the insulating film 733 having a function of preventing diffusion of hydrogen is preferably formed over the transistor 700 to cover the transistor 700 including an oxide semiconductor film. For the insulating film 733, a material that is similar to that of the insulating film 732 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the insulating film 733 covering the transistor 700, release of oxygen from the oxide semiconductor film included in the transistor 700 can be prevented and entry of water and hydrogen into the oxide semiconductor film can be prevented.

The plugs 711 to 715 preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co); an alloy of such a low-resistance material; or a compound containing such a material as its main component. It is particularly preferable to use a high-melting-point material that has heat resistance and conductivity, such as tungsten or molybdenum. The plugs 711 to 715 are preferably formed using a low-resistance conductive material such as aluminum or copper. The plugs 711 to 715 are particularly preferably formed using a Cu—Mn alloy because manganese oxide formed at the interface with an insulator containing oxygen has a function of preventing Cu diffusion.

The wirings 721, 722, 723, and 741 and the electrodes 725 and 726 preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co); an alloy of such a low-resistance material; or a compound containing such a material as its main component. It is particularly preferable to use a high-melting-point material that has heat resistance and conductivity, such as tungsten or molybdenum. The wirings 721, 722, 723, and 741 and the electrodes 725 and 726 are preferably formed using a low-resistance conductive material such as aluminum or copper. The wirings 721, 722, 723, and 741 and the electrodes 725 and 726 are particularly preferably formed using a Cu—Mn alloy because manganese oxide formed at the interface with an insulator containing oxygen has a function of preventing Cu diffusion.

The wiring 724 can be formed in the same manufacturing steps as the source and the drain of the transistor 700.

Although the capacitor 705 is formed over the transistor 700 and 701 in FIG. 10, the capacitor 705 may be formed over the transistor 701 and below the transistor 700.

The transistor described in Embodiment 2 may also be formed over the transistor 700 as necessary.

In FIG. 10, regions where reference numerals and hatching patterns are not given show regions formed using an insulator. These regions can be formed using an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, these regions can be formed using an organic resin such as a polyimide resin, a polyamide resin, an acrylic resin, a siloxane resin, an epoxy resin, or a phenol resin.

Figure 11A:
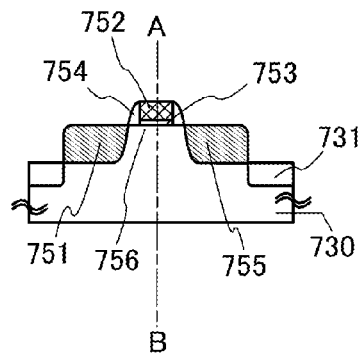
FIGS. 11A and 11B are cross-sectional views illustrating a semiconductor device structure example.
Figure 11B:
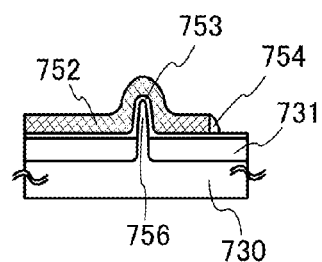

Here, the transistor 703 in FIGS. 11A and 11B may be used instead of the transistor 701. FIG. 11B illustrates a cross section taken along dashed dotted line A-B in FIG. 11A, which is perpendicular to a cross section in FIG. 11A. In the transistor 703, a semiconductor layer 756 (part of the semiconductor substrate) in which a channel is formed has a protruding portion, and the gate insulating film 753 and the gate electrode 752 are provided along top and side surfaces of the protruding portion. Furthermore, the element isolation layer 731 is provided between the transistors. The transistor 703 is also referred to as a FIN transistor because it utilizes a protruding portion of the semiconductor substrate. Note that an insulating film functioning as a mask for forming the protruding portion may be provided in contact with the top of the protruding portion. Although the protruding portion is formed by processing part of the semiconductor substrate here, a semiconductor layer having a protruding shape may be formed by processing an SOI substrate.

In addition, our study shows that the dependence of electron mobility of an OS transistor on channel length is not as large as the dependence of electron mobility of a Si transistor on channel length. Moreover, there is no clear reduction in field-effect mobility of an OS transistor even when channel length is shortened from 10 μm to 100 nm.

Therefore, when an OS transistor with a channel length of less than or equal to 10 μm is used, a difference in field-effect mobility between the OS transistor and a Si transistor becomes smaller than a difference when the channel length of the OS transistor is greater than or equal to 10 μm. When an OS transistor with a channel length of less than or equal to 100 nm is used, a difference in field-effect mobility can be reduced; specifically, the field-effect mobility of the OS transistor can be approximately $\frac{1}{30}$, preferably $\frac{1}{10}$, more preferably $\frac{1}{3}$ of a Si transistor.

When an OS transistor is used for a 100-nm-node transistor, it is possible to achieve field-effect mobility equivalent to that of a Si transistor. Thus, a microfabricated OS transistor can achieve switching speed and frequency characteristics that are equivalent to those of the Si transistor.

In addition, an OS transistor has low off-state current. In a circuit using an OS transistor, capacitance for holding charge can be low because of the low off-state current. Thus, a microfabricated OS transistor can achieve switching speed and frequency characteristics that are equivalent to those of the Si transistor.

The structure of this embodiment can be combined with any of the structures described in the other embodiments or examples as appropriate.

(Embodiment 4)

A storage device in one embodiment of the present invention can be used for display devices, personal computers, or image reproducing devices provided with recording media (typically, devices that reproduce the content of recording media such as digital versatile discs (DVDs) and have displays for displaying the reproduced images). Furthermore, as electronic devices that can include the storage device in one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 12A to 12F illustrate specific examples of these electronic devices.

Figure 12A:
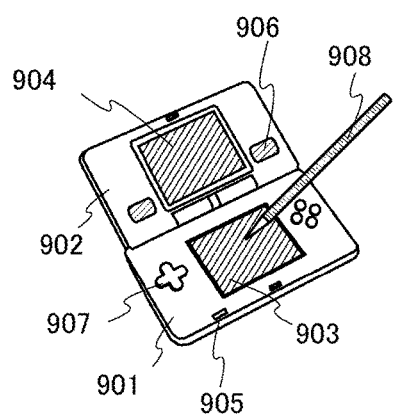
FIGS. 12A to 12F illustrate electronic device examples.

FIG. 12A illustrates a portable game machine, which includes housings 901 and 902, display portions 903 and 904, a microphone 905, speakers 906, an operation key 907, a stylus 908, and the like. Although the portable game machine in FIG. 12A has the two display portions 903 and 904, the number of display portions included in the portable game machine is not limited to this.

Figure 12B:
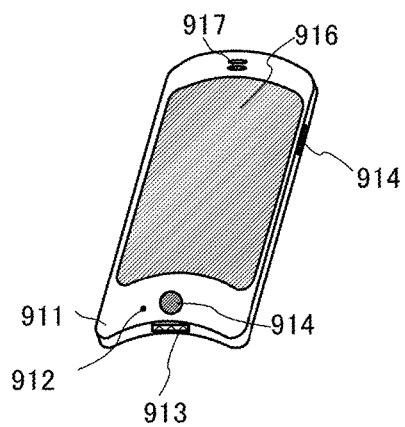

FIG. 12B illustrates a cellular phone, which includes a housing 911, a display portion 916, operation buttons 914, an external connection port 913, a speaker 917, a microphone 912, and the like. When the display portion 916 is touched with a finger or the like, data can be input into the cellular phone in FIG. 12B. Furthermore, operations such as making a call and inputting a letter can be performed by touch on the display portion 916 with a finger or the like. With the operation buttons 914, power ON/OFF can be switched. In addition, types of images displayed on the display portion 916 can be switched; for example, switching images from a mail creation screen to a main menu screen.

Figure 12C:
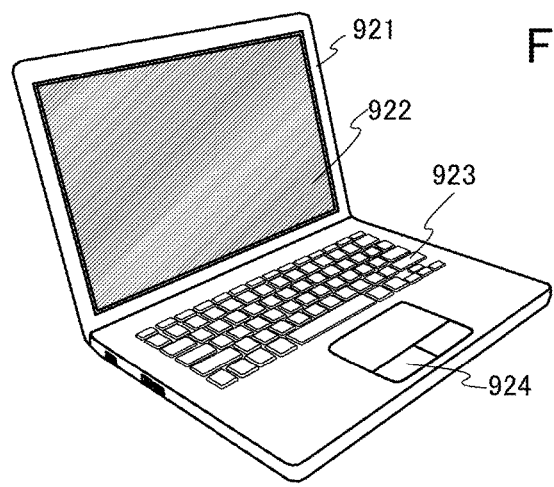

FIG. 12C illustrates a laptop, which includes a housing 921, a display portion 922, a keyboard 923, a pointing device 924, and the like.

Figure 12D:
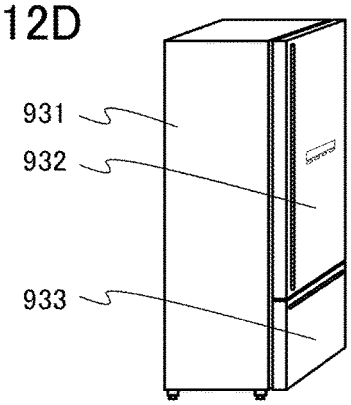

FIG. 12D illustrates an electric refrigerator-freezer, which includes a housing 931, a refrigerator door 932, a freezer door 933, and the like.

Figure 12E:
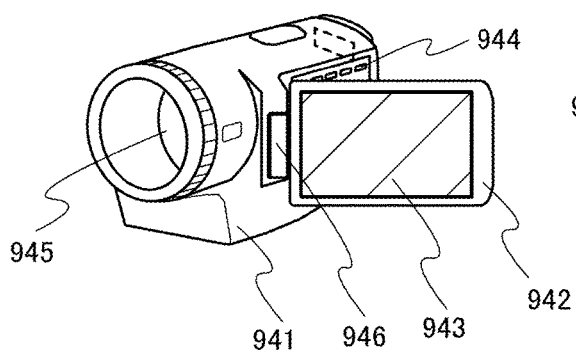

FIG. 12E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and an angle between the first housing 941 and the second housing 942 can be changed with the joint 946. An image displayed on the display portion 943 may be switched in accordance with the angle between the first housing 941 and the second housing 942 at the joint 946.

Figure 12F:
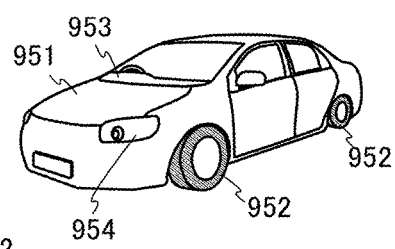

FIG. 12F illustrates an ordinary vehicle, which includes a car body 951, wheels 952, a dashboard 953, lights 954, and the like.

Figure 13:
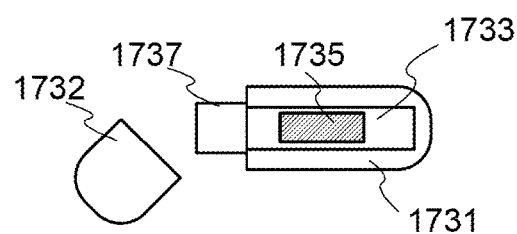
FIG. 13 illustrates a recording medium example.
Figure 14A:
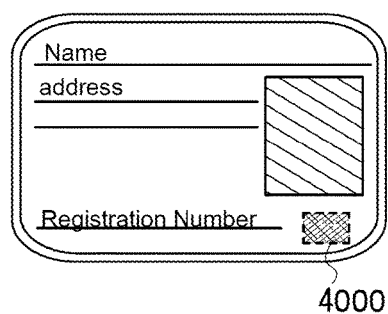
FIGS. 14A to 14F illustrate RF tag examples.
Figure 14B:
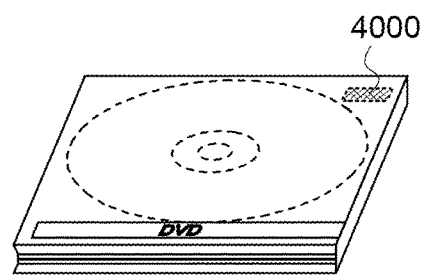
Figure 14C:
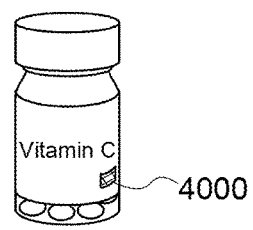
Figure 14D:
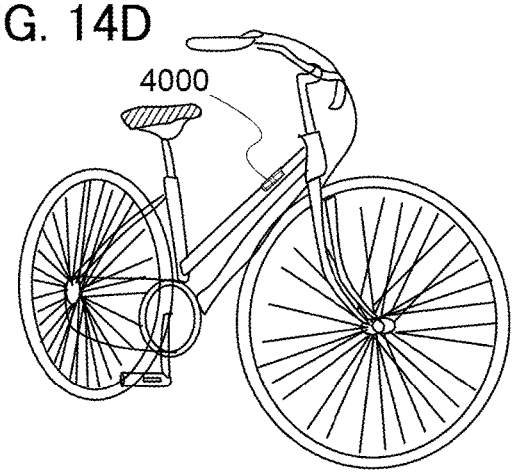
Figure 14E:
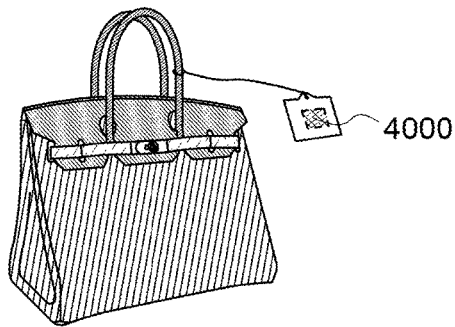
Figure 14F:
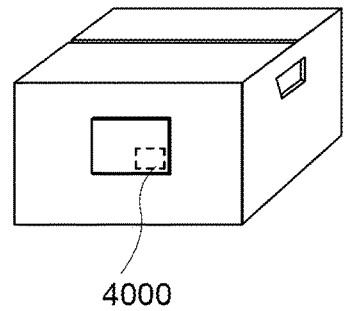

The storage device in one embodiment of the present invention can be used in a recording medium such as a memory card. FIG. 13 illustrates a memory card including a USB connector (commonly also called a USB memory, a USB stick, a pen drive, or the like) 1730. The memory card 1730 includes a main housing 1731 and a cap 1732. The housing 1731 includes a substrate 1733 and a USB connector 1737. The substrate 1733 is provided with a storage device 1735 in one embodiment of the present invention. A control circuit or the like may be provided over the substrate 1733 as necessary. The memory card 1730 may include a power source such as a battery as necessary.

Note that this embodiment can be combined with any of the other embodiments and examples in this specification as appropriate.

(Embodiment 5)

In this embodiment, application examples of an RF tag in which a storage device in one embodiment of the present invention is used are described with reference to FIGS. 14A to 14F. The RF tag is widely used and can be provided for, for example, products such as bills, coins, securities, bearer bonds, documents (e.g., driver's licenses or resident's cards, see FIG. 14A), recording media (e.g., DVDs or video tapes, see FIG. 14B), packaging containers (e.g., wrapping paper or bottles, see FIG. 14C), vehicles (e.g., bicycles, see FIG. 14D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 14E and 14F).

An RF tag 4000 in one embodiment of the present invention is fixed to products by being attached to a surface thereof or embedded therein. For example, the RF tag 4000 is fixed to each product by being embedded in paper of a book, or embedded in an organic resin of a package. Since the RF tag 4000 in one embodiment of the present invention can be reduced in size, thickness, and weight, the RF tag 4000 can be fixed to a product without spoiling the design of the product. Furthermore, bills, coins, securities, bearer bonds, documents, or the like can have an identification function by being provided with the RF tag 4000 in one embodiment of the present invention, and the identification function can be utilized to prevent counterfeiting. Moreover, the efficiency of a system such as an inspection system can be improved by providing the RF tag in one embodiment of the present invention for packaging containers, recording media, personal belongings, foods, clothing, household goods, electronic devices, or the like. Vehicles can also have higher security against theft or the like by being provided with the RF tag in one embodiment of the present invention.

As described above, by using the RF tag in one embodiment of the present invention for each application described in this embodiment, power for operation such as data writing or data reading can be reduced, which results in an increase in the maximum communication distance. Moreover, data can be retained for an extremely long period even in a state where power is not supplied; thus, the RF tag in one embodiment of the present invention can be favorably used for application in which data is not frequently written or read.

Note that this embodiment can be combined with any of the other embodiments and examples in this specification as appropriate.

This application is based on Japanese Patent Application serial No. 2014-107401 filed with Japan Patent Office on May 23, 2014, the entire contents of which are hereby incorporated by reference.

What is claimed is:

1. A storage device comprising:
  a first circuit;
  a second circuit;
  a third circuit; and
  a memory cell,
  wherein the first circuit is configured to detect power-on of the storage device,
  wherein the second circuit is configured to specify an address of the memory cell,
  wherein the third circuit is configured to refresh the memory cell at the address specified by the second circuit after the first circuit detects power-on of the storage device,
  wherein the third circuit is configured to refresh the memory cell only once during any length of the time period between the power-on of the storage device and a power-off of the storage device, and
  wherein the memory cell comprises a first transistor comprising an oxide semiconductor in a channel.

2. The storage device according to claim 1, wherein the memory cell comprises a capacitor.

3. The storage device according to claim 1,
  wherein the memory cell comprises a second transistor, and
  wherein a channel of the second transistor comprises a semiconductor whose bandgap is narrower than a bandgap of the oxide semiconductor.

4. The storage device according to claim 1, wherein the memory cell is configured to retain multilevel data.

5. The storage device according to claim 1, wherein the oxide semiconductor comprises indium, zinc, and M, where M is selected from the group of Al, Ti, Ga, Y, Zr, La, Ce, Nd, and Hf.

6. An electronic device comprising:
  the storage device according to claim 1; and
  at least one of a microphone, a speaker, a display portion, and an operation key.

7. A storage device comprising:
  a first circuit;
  a second circuit;
  a third circuit; and
  a memory cell, wherein the first circuit is configured to detect power-on of the storage device, wherein the second circuit is configured to specify an address of the memory cell, wherein the third circuit is configured to refresh the memory cell at the address specified by the second circuit after the first circuit detects power-on of the storage device, wherein the third circuit is configured to refresh the memory cell only once during any length of the time period between the power-on of the storage device and a power-off of the storage device, wherein the memory cell comprises a first transistor comprising an oxide semiconductor in a channel and a second transistor, and wherein one of a source electrode and a drain electrode of the first transistor is electrically connected to a gate electrode of the second transistor.

8. The storage device according to claim 7, wherein the memory cell comprises a capacitor.

9. The storage device according to claim 7, wherein a channel of the second transistor comprises a semiconductor whose bandgap is narrower than a bandgap of the oxide semiconductor.

10. The storage device according to claim 7, wherein the memory cell is configured to retain multilevel data.

11. The storage device according to claim 7, wherein the oxide semiconductor comprises indium, zinc, and M, where M is selected from the group of Al, Ti, Ga, Y, Zr, La, Ce, Nd, and Hf.

12. An electronic device comprising:
the storage device according to claim 7; and
at least one of a microphone, a speaker, a display portion, and an operation key.

13. A storage device comprising:
a first circuit;
a second circuit;
a third circuit; and
a memory cell, wherein the first circuit is configured to detect power-on of the storage device, wherein the second circuit is configured to specify an address of the memory cell, wherein the third circuit is configured to refresh the memory cell at the address specified by the second circuit after the first circuit detects power-on of the storage device, wherein the third circuit is configured to refresh the memory cell only once during any length of the time period between the power-on of the storage device and a power-off of the storage device, wherein the memory cell comprises a transistor comprising an oxide semiconductor in a channel and a capacitor, and wherein one of a source electrode and a drain electrode of the transistor is electrically connected to an electrode of the capacitor.

14. The storage device according to claim 13, wherein a gate electrode of the transistor is electrically connected to a wiring.

15. The storage device according to claim 13, wherein the other of the source electrode and the drain electrode of the transistor is electrically connected to a wiring.

16. The storage device according to claim 13, wherein the memory cell is configured to retain multilevel data.

17. The storage device according to claim 13, wherein the oxide semiconductor comprises indium, zinc, and M, where M is selected from the group of Al, Ti, Ga, Y, Zr, La, Ce, Nd, and Hf.

18. An electronic device comprising:
the storage device according to claim 13; and
at least one of a microphone, a speaker, a display portion, and an operation key.

\* \* \* \* \*